(12) United States Patent
Mentovich et al.

(10) Patent No.: US 12,163,228 B2
(45) Date of Patent: Dec. 10, 2024

(54) CVD SYSTEM WITH SUBSTRATE CARRIER AND ASSOCIATED MECHANISMS FOR MOVING SUBSTRATE THERETHROUGH

(71) Applicants: MELLANOX TECHNOLOGIES, LTD., Yokneam (IL); BAR-ILAN UNIVERSITY, Ramat Gan (IL); RAMOT AT TEL-AVIV UNIVERSITY LTD., Tel Aviv (IL); SIMTAL NANO-COATINGS LTD, Shimshit (IL)

(72) Inventors: Elad Mentovich, Tel Aviv (IL); Yaniv Rotem, Nesher (IL); Yaakov Gridish, Yoqneam Ilit (IL); Doron Naveh, Petah-Tikva (IL); Chen Stern, Kiryat Ono (IL); Yosi Ben-Naim, Eilat (IL); Ariel Ismach, Rosh Haain (IL); Eran Bar-Rabi, Shimshit (IL); Tal Kaufman, Shimshit (IL)

(73) Assignees: MELLANOX TECHNOLOGIES, LTD., Yokneam (IL); BAR-ILAN UNIVERSITY, Ramat Gan (IL); RAMOT AT TEL-AVIV UNIVERSITY LTD., Tel Aviv (IL); SIMTAL NANO-COATINGS LTD, Shimshit (IL)

( * ) Notice: Subject to any disclaimer, the term of this patent is extended or adjusted under 35 U.S.C. 154(b) by 289 days.

(21) Appl. No.: 17/305,206

(22) Filed: Jul. 1, 2021

(65) Prior Publication Data

US 2022/0372621 A1 Nov. 24, 2022

Related U.S. Application Data

(60) Provisional application No. 63/201,910, filed on May 18, 2021.

(51) Int. Cl.
*C23C 16/458* (2006.01)
(52) U.S. Cl.
CPC ...... *C23C 16/4581* (2013.01); *C23C 16/4586* (2013.01)
(58) Field of Classification Search
None
See application file for complete search history.

(56) References Cited

U.S. PATENT DOCUMENTS

| 3,672,948 A | 6/1972 | Foehring |
| 4,417,722 A | 11/1983 | Ishii |

(Continued)

FOREIGN PATENT DOCUMENTS

| CN | 105779961 A | 7/2016 |
| DE | 112013006022 T5 | 9/2015 |

(Continued)

OTHER PUBLICATIONS

Steinberg et al., pending U.S. Appl. No. 18/200,314, filed May 22, 2023.

(Continued)

*Primary Examiner* — Jeffrie R Lund
*Assistant Examiner* — Tiffany Z Nuckols
(74) *Attorney, Agent, or Firm* — Michele M. Glessner; Moore & Van Allen PLLC

(57) ABSTRACT

A substrate carrier and a mechanism for moving the substrate carrier through a chemical vapor deposition system are provided. The substrate carrier includes a cylindrical housing having an interior surface. A plurality of plurality of shelves fixed to the interior surface, each shelf configured to support at least one substrate. The substrate carrier may include a connector configured to engage the substrate carrier with the mechanism. The mechanism may include a moveable arm and a motor configured to actuate the move- (Continued)

able arm. The moveable arm may include an actuating member connected to the motor and configured to move the moveable arm between a retracted state and an extended state. The moveable arm may be configured to operate in a chamber having a first pressure and a first temperature and the motor may be configured to operate in an environment having a second pressure.

26 Claims, 13 Drawing Sheets

(56) References Cited

U.S. PATENT DOCUMENTS

| | | |
|---|---|---|
| 4,450,034 A | 5/1984 | Stern |
| 4,455,181 A | 6/1984 | Lifshin et al. |
| 4,931,425 A | 6/1990 | Kimura |
| 5,108,532 A | 4/1992 | Thein et al. |
| 5,256,474 A | 10/1993 | Johnston |
| 6,117,266 A | 9/2000 | Horzel et al. |
| 6,432,239 B1 | 8/2002 | Mandai et al. |
| 7,798,096 B2 | 9/2010 | Mahajani et al. |
| 9,215,797 B2 | 12/2015 | Mori et al. |
| 9,384,875 B2 | 7/2016 | Kimura et al. |
| 9,431,487 B2 | 8/2016 | Bol et al. |
| 9,924,619 B2 | 3/2018 | Kim et al. |
| 10,022,947 B2 | 7/2018 | Kimura et al. |
| 10,518,506 B2 | 12/2019 | Miyazono et al. |
| 10,717,260 B2 | 7/2020 | Shimizu et al. |
| 11,105,567 B2 | 8/2021 | Fan et al. |
| 2005/0112344 A1 | 5/2005 | Redfern et al. |
| 2006/0042059 A1 | 3/2006 | Satoh |
| 2008/0173238 A1 | 7/2008 | Nakashima et al. |
| 2010/0047447 A1* | 2/2010 | Cook .................. C23C 16/46 |
| | | 118/500 |
| 2010/0068383 A1 | 3/2010 | Kato et al. |
| 2010/0068893 A1 | 3/2010 | Kato et al. |
| 2010/0196124 A1* | 8/2010 | Fukuma ............ H01L 21/67748 |
| | | 414/217 |
| 2011/0076118 A1* | 3/2011 | Kurita ............... H01L 21/67742 |
| | | 414/217 |
| 2011/0091646 A1 | 4/2011 | Aliatieh |
| 2011/0123776 A1 | 5/2011 | Shin et al. |
| 2013/0108839 A1 | 5/2013 | Arnold et al. |
| 2013/0189635 A1 | 7/2013 | Lim |
| 2013/0248229 A1 | 9/2013 | Martens |
| 2013/0299077 A1 | 11/2013 | Hong |
| 2013/0344246 A1 | 12/2013 | Li |
| 2014/0053973 A1 | 2/2014 | Shin et al. |
| 2015/0064470 A1 | 3/2015 | Kimura et al. |
| 2015/0123080 A1 | 5/2015 | Yamaguchi |
| 2015/0360370 A1* | 12/2015 | Mazzocco ............ B25J 15/0616 |
| | | 294/119.1 |
| 2016/0027935 A1 | 1/2016 | Naito et al. |
| 2016/0049475 A1 | 2/2016 | Bol et al. |
| 2016/0076829 A1 | 3/2016 | Lee et al. |
| 2016/0079001 A1 | 3/2016 | Lin et al. |
| 2016/0093478 A1 | 3/2016 | Guo |
| 2017/0029279 A1 | 2/2017 | Kim |
| 2017/0125136 A1 | 5/2017 | Park et al. |
| 2017/0130336 A1 | 5/2017 | Fujikura |
| 2017/0207484 A1 | 7/2017 | Zhamu et al. |
| 2017/0211706 A1 | 7/2017 | Amir |
| 2017/0273181 A1 | 9/2017 | Sohn et al. |
| 2017/0290167 A1 | 10/2017 | Pun et al. |
| 2017/0338312 A1 | 11/2017 | Treossi et al. |
| 2019/0047262 A1 | 2/2019 | Minakuchi et al. |
| 2019/0143369 A1 | 5/2019 | Lin et al. |
| 2019/0143656 A1 | 5/2019 | Lin et al. |
| 2019/0145007 A1 | 5/2019 | Lin et al. |
| 2019/0283377 A1 | 9/2019 | Lin et al. |
| 2019/0283378 A1 | 9/2019 | Lin et al. |
| 2019/0283379 A1 | 9/2019 | Lin et al. |
| 2019/0284712 A1 | 9/2019 | Lin et al. |
| 2019/0292675 A1 | 9/2019 | Lin et al. |
| 2019/0292676 A1 | 9/2019 | Lin et al. |
| 2019/0292720 A1 | 9/2019 | Lin et al. |
| 2019/0292721 A1 | 9/2019 | Lin et al. |
| 2019/0292722 A1 | 9/2019 | Lin et al. |
| 2019/0332015 A1 | 10/2019 | Poiesz et al. |
| 2021/0091368 A1 | 3/2021 | House et al. |
| 2021/0091383 A1 | 3/2021 | House et al. |
| 2021/0100090 A1 | 4/2021 | Chang |
| 2021/0125850 A1* | 4/2021 | Chen ................ H01L 21/67706 |
| 2021/0139700 A1 | 5/2021 | Arimoto et al. |
| 2021/0184181 A1 | 6/2021 | Ding |
| 2021/0260859 A1 | 8/2021 | Le Rhun et al. |
| 2022/0131040 A1 | 4/2022 | Chen et al. |
| 2022/0161537 A1 | 5/2022 | Quellmalz et al. |
| 2022/0169002 A1 | 6/2022 | Honda et al. |
| 2022/0204348 A1 | 6/2022 | Gao et al. |
| 2022/0372622 A1 | 11/2022 | Mentovich |
| 2022/0377907 A1 | 11/2022 | Mentovich |
| 2022/0377912 A1 | 11/2022 | Atias |
| 2023/0002906 A1 | 1/2023 | Mentovich |
| 2023/0007788 A1 | 1/2023 | Atias |
| 2023/0007789 A1 | 1/2023 | Mentovich |

FOREIGN PATENT DOCUMENTS

| | | |
|---|---|---|
| EP | 3723122 A1 | 10/2020 |
| KR | 20190058231 A | 5/2019 |
| WO | 2015062760 A1 | 5/2015 |
| WO | 2020152358 A1 | 7/2020 |

OTHER PUBLICATIONS

Steinberg et al., pending U.S. Appl. No. 18/200,352, filed May 22, 2023.
Chinese Office Action from corresponding Chinese Application No. 202210515308.4 dated Oct. 28, 2023, 4 pages, with English Translation.
Zuo Dunwen, "Modern Processing Technology," Beijing University of Aeronautics and Astronautics Press, pp. 299-301, Mar. 31, 2005.
Xu Binshi, "Material Surface Engineering," Harbin Institute of Technology Press, p. 300, Dec. 31, 2014.

* cited by examiner

CVD SYSTEM WITH SUBSTRATE CARRIER AND ASSOCIATED MECHANISMS FOR MOVING SUBSTRATE THERETHROUGH

CROSS-REFERENCE TO RELATED APPLICATIONS

This application claims priority to U.S. Provisional Patent Application No. 63/201,910, filed May 18, 2021, the contents of which are incorporated herein by reference in their entirety.

TECHNOLOGICAL FIELD

Example embodiments of the present disclosure relate generally to a chemical vapor deposition system and more particularly to a chemical vapor deposition system that includes a substrate carrier and a set of mechanisms for moving the substrate carrier through the chemical vapor deposition system.

BACKGROUND

Chemical vapor deposition is an industrial process used to deposit a thin film of a desired material onto a substrate for use in a variety of technical applications. Applicant has identified a number of deficiencies and problems associated with present systems and methods for performing chemical vapor deposition. Through applied effort, ingenuity, and innovation, many of these identified problems have been solved by developing solutions that are included in embodiments of the present disclosure, many examples of which are described in detail herein.

BRIEF SUMMARY

In an embodiment, a mechanism for moving a substrate carrier through a chemical vapor deposition system is provided. The mechanism comprises a moveable arm. The mechanism further comprises a motor configured to actuate the moveable arm, where the moveable arm comprises an actuating member connected to the motor and configured to move the moveable arm between a retracted state and an extended state, where the moveable arm is configured to operate in a chamber having a first pressure and a first temperature, and where the motor is located outside the chamber in an environment having a second pressure.

In some embodiments, the moveable arm comprises a fixed end comprising a backplate configured to be attached to a fixed surface. In some embodiments, the moveable arm further comprises a moveable end opposite the fixed end and configured to engage with a substrate carrier. In some embodiments, the moveable arm further comprises an extendable member disposed between and connected to the moveable end and the fixed end, where the extendable member is configured to extend and retract.

In some embodiments, the moveable end further comprises a plate having an aperture, where the aperture is configured to receive a first U-shaped member from a first side of the plate, and where the first U-shaped member has an input length. In some embodiments, the moveable end further comprises a second U-shaped member disposed on a second side of the plate and extending outwards from the plate. In some embodiments, the moveable end further comprises a rod extending between and connecting legs of the second U-shaped member. In some embodiments, the moveable end further comprises a ring supported by the second rod, where, when the first U-shaped member is received through the aperture, the ring is configured to rotate around the rod until the input length of the first U-shaped member has been received through the aperture. In some embodiments, the moveable end is configured to be engaged with the substrate carrier when the input length of the first U-shaped member has been received through the aperture.

In some embodiments, the actuating member is in mechanical communication with the motor via a rotary feedthrough.

In some embodiments, the extendable member has a first length when the moveable arm is in the retracted state and a second length when the moveable arm is in the extended state. In some embodiments, the second length is at least five times the first length.

In some embodiments, the moveable arm comprises at least one of stainless steel alloy, titanium alloy, or bronze.

In some embodiments, the first temperature is set such that graphene deposition can be performed on a substrate in the chemical vapor deposition system. In some embodiments, the first pressure is a substantially vacuum pressure and the second pressure is a substantially atmospheric pressure.

In another embodiment, a substrate carrier for moving a plurality of substrates through a chemical vapor deposition system is provided. The substrate carrier comprises a cylindrical housing having an interior surface. The substrate carrier further comprises a plurality of shelves fixed to the interior surface of the cylindrical housing, each shelf of the plurality of shelves configured to support at least one substrate of the plurality of substrates, and where the shelves are spaced apart from adjacent shelves of the plurality of shelves along a vertical axis of the cylindrical housing. The substrate carrier further comprises a connector fixed to the substrate carrier and configured to engage the substrate carrier with a transport mechanism.

In some embodiments, the cylindrical housing may comprise at least one of quartz or graphite.

In some embodiments, the substrate carrier may further comprise a first coating deposited on the interior surface of the cylindrical housing and/or an exterior surface of the cylindrical housing. In some embodiments, the first coating may comprise at least one of graphite, carbon, tungsten nitride, molybdenum nitride, tantalum nitride, titanium nitride, silicon nitride, silicon carbide, or a combination thereof. In some embodiments, the substrate carrier may further comprise a second coating deposited over the first coating on the interior surface of the cylindrical housing and/or the exterior surface of the cylindrical housing. In some embodiments, the second coating may comprise either at least one of tungsten, molybdenum, tantalum, titanium, or a combination thereof or at least one of graphite, boron nitride, molybdenum silicide, or a combination thereof.

In some embodiments, the connector comprises a U-shaped member.

In some embodiments, the substrate carrier may further comprise a plurality of quartz legs disposed on the exterior surface of the substrate carrier configured to stabilize the substrate carrier inside the chemical vapor deposition system.

In some embodiments, a first space between a first shelf and a second shelf of the plurality of shelves is greater than a second space between a third shelf and a fourth shelf of the plurality of shelves. In some embodiments, each shelf of the plurality of shelves may be configured to be individually removed from the substrate carrier.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Figure 1:
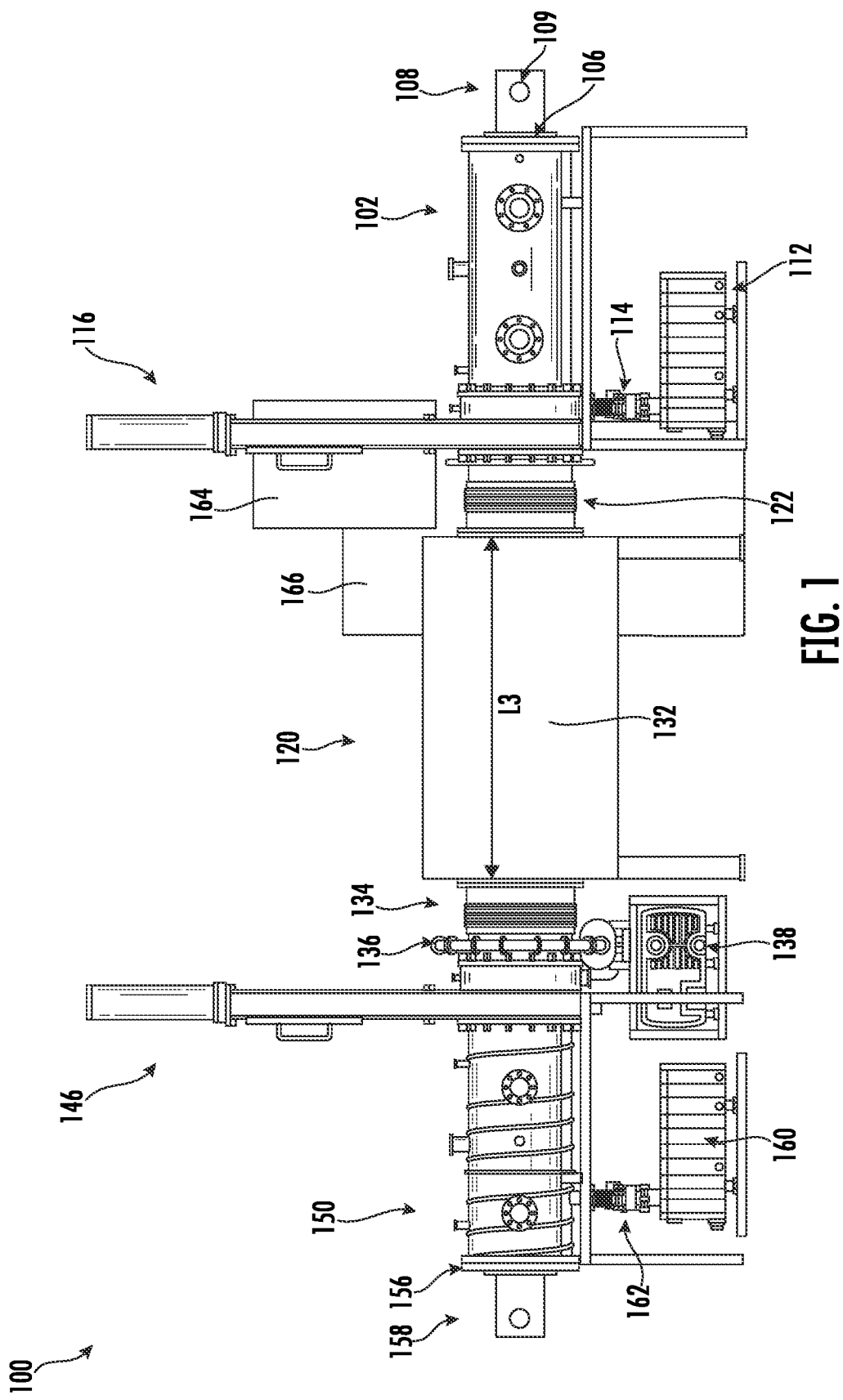
FIG. 1 illustrates an example chemical vapor deposition system in accordance with one or more embodiments of the present invention.

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

Chemical vapor deposition (CVD) is an industrial process that uses chemical reactions to deposit a thin film of a desired material onto a substrate for use in a variety of technical applications. In many conventional CVD systems, a substrate may be placed inside a substrate carrier, and the substrate carrier may be placed inside a reactive chamber of the CVD system. Once the substrate carrier is inside the reactive chamber, the pressure in the reactive chamber may be adjusted to ensure that the pressure is at substantially vacuum pressure, and the temperature in the reactive chamber is increased to a necessary reactive temperature. Then, deposition gases are introduced into the reactive chamber causing a reaction to occur that deposits a thin film of the desired material onto the substrate. After enough of the desired material has been deposited onto the substrate, the deposition gases are removed from the reactive chamber, the temperature is reduced to a safe handling temperature, and the pressure in the reactive chamber may be adjusted to allow for the substrate carrier to be removed from the reactive chamber.

Producing the desired material using the conventional CVD system described above limits both the quantity and the quality of the desired material that can be produced within a time frame because the conventional CVD system suffers from long periods of pressure and temperature adjustment in which a CVD process is not being performed on the substrate in the substrate carrier. In particular, each time a new substrate carrier is placed inside the reactive chamber, there is a waiting period while the pressure in the reactive temperature is adjusted to substantially vacuum pressure and the temperature inside the reactive chamber is increased to the necessary reactive temperature. Then, after the deposition of the desired material on the substrate is complete, there is another waiting period while the deposition gases are evacuated from the reactive chamber, the temperature is reduced to the safe handling temperature, and the pressure is adjusted to allow for the substrate to be removed from the reactive chamber.

In order to produce high-quality sheets of the desired material using the CVD process described above, it is essential that the desired material is deposited uniformly onto the substrate. To obtain uniform deposition, it is necessary for the reaction to occur evenly at all points on the substrate. This can be achieved by promoting substantially uniform and laminar flow of the deposition gases over the substrate as well as ensuring substantially uniform temperature at all points on the substrate during the CVD process. Laminar flow is a type of gas flow in which the gas flows in lines or layers such that there is no disruption between the lines or layers nor turbulence, vortices, or compressible movement, such that the velocity of the molecules of the gas slowly varies in space with a smooth, continuous divergence. In uniform flow, the properties and flux of the gas, have high uniformity across the cross-section of the gas. In other words, promoting substantially uniform and laminar flow of the deposition gases over the substrate ensures that there is an even spread of the deposition gases over the entire surface of the substrate and, together with promoting uniformity of temperature at all points on the substrate, ensures uniform deposition of the desired material onto the substrate.

The substrate carriers used in many conventional CVD systems, as described above, may reduce the quantity and quality of the desired material that can be produced in at least two ways. First, the structural components and/or configuration of the substrate carrier may interfere with the uniform and laminar flow of the deposition gases and, as a result, introduce turbulence and non-uniformity into the flow of the deposition gases as the deposition gases flow over the substrate. Second, even if the reactive chamber of the CVD system is evenly heated, the substrate carrier may absorb and reflect heat unevenly, thus causing the temperature to be different at different points on the substrate. These negative effects on flow and temperature may be exacerbated when the substrate carrier is configured to hold multiple substrates. In other words, as the number of substrates held by the substrate carrier is increased, the substrate carrier tends to have an increasingly negative effect on the flow of the deposition gases as well as the uniformity of temperature across the substrate(s). Thus, the substrate carriers used in conventional CVD systems prevent such systems from being able to produce both substantial quantities of the desired material and detract from the quality of the desired material that may be produced.

Thus, to address the above identified issues of conventional CVD systems and methods, a substrate carrier and a CVD system that includes components that enable the mass production of substantial quantities of high-quality sheets of a desired material is disclosed herein. In some embodiments, the CVD system and its components may be part of a continuous-feed CVD system, such as the system described in the application titled CONTINUOUS-FEED CVD SYSTEM, Ser. No. 17/305,203, filed concurrently with the present application and the contents of which are hereby incorporated by reference in their entirety. Further, in some embodiments, the CVD system may include further components configured for facilitating uniform and laminar flow, such as the components described in the application titled CVD SYSTEM WITH FLANGE ASSEMBLY FOR FACILITATING UNIFORM AND LAMINAR FLOW, Ser. No. 17/305,209, filed concurrently with the present application and the contents of which are hereby incorporated by reference in their entirety. Further, in some embodiments, the CVD system and its components may be used to perform several types of processes, such as the processes described in the applications titled PROCESS FOR LAMINATING GRAPHENE-COATED PRINTED CIRCUIT BOARDS, Ser. No. 17/305,205; PROCESS FOR LAMINATING CONDUCTIVE-LUBRICANT COATED METALS FOR PRINTED CIRCUIT BOARDS, Ser. No. 17/305,223; PROCESS FOR LOCALIZED REPAIR OF GRAPHENE-COATED LAMINATION STACKS AND PRINTED CIRCUIT BOARDS, Ser. No. 17/305,233; PROCESS FOR APPLYING A TWO-DIMENSIONAL MATERIAL TO A TARGET SUBSTRATE POST-LAMINATION, Ser. No. 17/305,238; each of which is filed concurrently with the present application. The contents of each of the foregoing applications are hereby incorporated by reference in their entirety.

According to embodiments of the invention and as described in greater detail below, the CVD system includes three independent chambers, each of which is capable of processing substrates simultaneously. In particular, the CVD system may include an input chamber, a process chamber downstream from the input chamber and connected to the input chamber via a first gate valve, and an output chamber downstream from the process chamber and connected to the process chamber via a second gate valve.

According to embodiments of the invention and as described in greater detail below, while the CVD system is in use, the process chamber is configured to continuously operate at substantially vacuum pressure and the necessary reactive temperature. The process chamber may be further configured to, during an operational state, perform a CVD process on a plurality of substrates in a substrate carrier received from the input chamber. While the process chamber is in the operational state, the input chamber is configured to receive a subsequent plurality of substrates held in a subsequent substrate carrier and, after receiving the subsequent substrate carrier, the pressure in the input chamber may be reduced to substantially vacuum pressure in preparation for entry into the process chamber. Moreover, while the process chamber is in the operational state, the output chamber may be configured to cool down a previous plurality of substrates held in a previous substrate carrier that was received from the process chamber, increase the pressure in the output chamber to substantially atmospheric pressure, and discharge, or allow for the removal of, the previous substrate carrier from the system. As a result, embodiments of the CVD system disclosed herein eliminate the long periods of pressure and temperature adjustment associated with present systems and methods of CVD, thus enabling the mass production of the desired material in a more cost-effective and timely manner.

According to embodiments of the invention and as described in greater detail below, the CVD system may be configured to perform the CVD process on a plurality of substrates held within the substrate carrier. The substrate carrier may have an aerodynamic design such that both substantially uniform flow and laminar flow of the gases are facilitated and maintained over the entire area of each substrate during the CVD process. Further, the substrate carrier may be designed such that it has high emissivity and high thermal conductivity, promoting a substantially uniform temperature at all points on each substrate during the CVD process. As a result, embodiments of the substrate carrier may enable a large number of substrates to be processed at the same time, thus increasing the amount of the desired material that can be produced within a time frame, while still ensuring that the desired material that is produced is high-quality.

According to embodiments of the invention and as described in greater detail below, the CVD system may further include a unique set of mechanisms that are configured to increase the amount of the desired material that can be produced within a time frame. The set of mechanisms may include a first mechanism configured for transferring the substrate carrier from the input chamber to the process chamber and a second mechanism configured for transferring the substrate carrier from the process chamber to the output chamber. The mechanisms are designed such that each of them can operate within the harsh environment (e.g. high temperature, low pressure, and presence of reactive gases) of the CVD system, either automatically or in response to actuation by a remote operator. As a result, as soon as the process chamber has finished the CVD process on the substrate carrier, the second mechanism may move into the process chamber, engage with the substrate carrier, and transfer the substrate carrier to the output chamber. At the same time, the first mechanism may be configured to engage with the subsequent substrate carrier and move the subsequent substrate carrier into the process chamber for processing. Because the set of mechanisms is configured to operate within the harsh environment of the CVD system, the transfer of the substrate carrier between chambers can occur without having to substantially adjust the pressure or the temperature within the process chamber. As a result, the amount of material that can be produced within a time frame may be increased.

Further, the set of mechanisms may be configured such that the mechanisms do not occupy a substantial amount of valuable floor space. When the substrate carrier is not being transferred between the chambers of the CVD system, such as when the process chamber is in the operational state, the moveable arm of each mechanism is configured to be housed in a compact mechanism housing. This can be accomplished because the moveable arm of each mechanism may be able to adjust between a retracted state and an extended state. In the extended state, a first length of each moveable arm may be substantially longer than a second length of each moveable arm in the retracted state. For example, the first length may be more than five times longer than the second length. As a result, the set of mechanisms is configured such that each mechanism is capable of moving the substrate carrier through the CVD system and is further configured such that each mechanism is capable of being housed in a compact mechanism housing when not in use. Thus, employing the set of mechanisms serves to reduce the amount of floor space taken up by the CVD system.

While embodiments of the invention may be applied to CVD processes for depositing a variety of materials, embodiments of the invention described herein may be advantageous in the production of high-quality graphene. Graphene is a two-dimensional allotrope of carbon that comprises a single layer of carbon atoms arranged in a hexagonal honeycomb lattice. Graphene possess a unique combination of electromagnetic, thermal, and structural properties, such that graphene has the potential to revolutionize a variety of technologies, including electronic devices, optoelectronic devices, light emitting diodes, touch screens, electrical contacts, flexible electrodes, transparent electrodes, supercapacitors, batteries, Q-bit computing, optical sensors, chemical sensors, etc. However, successful implementation of graphene in such technologies has been severely limited by the inability of conventional CVD systems to produce substantial quantities of high-quality sheets of graphene. Embodiments of the invention disclosed herein and described in greater detail below enable the mass production of substantial quantities of high-quality sheets of a graphene.

CVD System

With reference to FIGS. 1-13, a CVD system 100 and components of the CVD system 100 are illustrated. As shown, embodiments of the CVD system 100 may include an input chamber 102 configured for receiving a plurality of substrates that are held by a substrate carrier 1300. As described herein, the CVD system 100 may include a process chamber 120 downstream from the input chamber 102. The process chamber 120 may be configured to receive the substrate carrier 1300 from the input chamber 102. The process chamber 120 may be connected to the input chamber 102 via a first gate valve 116 and may further be configured to perform a CVD process on the plurality of substrates in the substrate carrier 1300 when the process chamber 120 is in an operational state.

The input chamber 102, in turn, may be configured to receive a subsequent substrate carrier (e.g., a substrate carrier that will be entering the process chamber 120 following the substrate carrier 1300 currently being processed in the process chamber 120) while the CVD process is being performed on the plurality of substrates in the substrate carrier 1300 in the process chamber 120. Thus, the input chamber 102 may effectively be used to prepare a subsequent substrate carrier for entry into the process chamber 120 while the process chamber 120 is in operation with respect to a different substrate carrier, such as the substrate carrier 1300.

In addition, the CVD system 100 may comprise an output chamber 150 downstream from the process chamber 120, and the output chamber 150 may be configured to discharge, or allow for the removal of, a previous substrate carrier while the CVD process is being performed on the plurality of substrates in the substrate carrier 1300 in the process chamber 120. For example, the output chamber 150 may be configured to receive the substrate carrier 1300 from the process chamber 120. The output chamber 150 may be connected to the process chamber 120 via a second gate valve 146. Thus, as described herein, the process chamber 120 may be configured to be environmentally isolated from the input chamber 102 and the output chamber 150 when the CVD process is being performed on the plurality of substrates in the substrate carrier 1300 within the process chamber 120.

The process chamber 120 may further include an oven 132 configured for containing the substrate carrier 1300 during the CVD process and maintaining the necessary reactive temperature around the plurality of substrates during the CVD process. The process chamber 120 may further include a first tubular connector 122 disposed between the first gate valve 116 and the oven 132. The first tubular connector 122 may be configured to introduce at least one gas into the process chamber 120. In some embodiments, the introduction of the at least one gas may be controlled, at least in part, via a gas control cabinet 164. In some embodiments, the first tubular connector 122 may be connected to a supply (not shown) of the at least one gas. The process chamber 120 may further include a second tubular connector 134 disposed between the oven 132 and the second gate valve 146. The second tubular connector 134 may be configured for removing the at least one gas from the process chamber 120, as described in greater detail below. In some embodiments, a pump 138 may be connected to the process chamber 120 via piping 136 and may be configured to control the pressure in the process chamber 120.

As described above, the input chamber 102 and the process chamber 120 may be connected to each other via the first gate valve 116. In some embodiments, the first gate valve 116 may be a different type of valve, other than a gate valve. The first gate valve 116 may be opened to enable the substrate carrier 1300 to be transferred from the input chamber 102 to the process chamber 120. The first gate valve 116 may be closed to environmentally isolate the input chamber 102 from the process chamber 120. For example, the first gate valve 116 may be closed when the CVD process is being performed on the plurality of substrates in the substrate carrier 1300 in the process chamber 120. Similarly, as described above, on a downstream end of the process chamber 120, the process chamber 120 and the output chamber 150 may be connected to each other via the second gate valve 146. In some embodiments, the second gate valve 146 may be a different type of valve, other than a gate valve. The second gate valve 146 may be opened to enable the substrate carrier 1300 to be transferred from the process chamber 120 to the output chamber 150. The second gate valve 146 may be closed to environmentally isolate the output chamber 150 from the process chamber 120. For example, the second gate valve 146 may be closed when the CVD process is being performed on the plurality of substrates in the substrate carrier 1300 in the process chamber 120.

Figure 10:
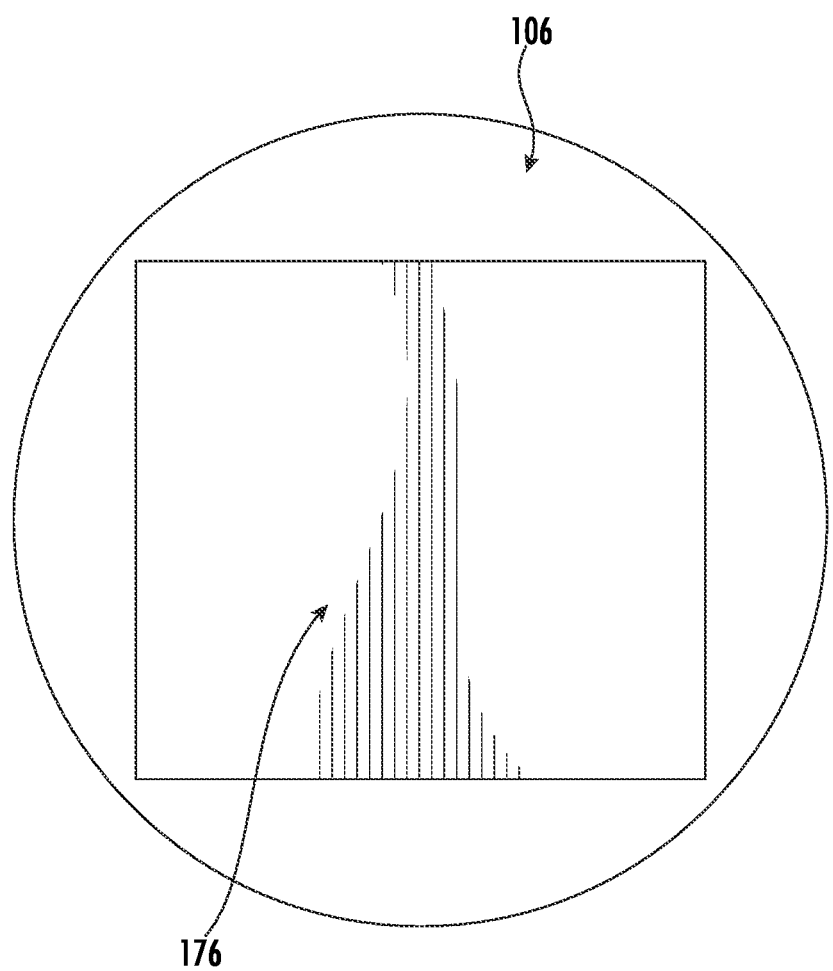
FIG. 10 is a cross-sectional view of a first door in accordance with one or more embodiments of the present invention.

As described above and shown in FIG. 1, the CVD system 100 includes the input chamber 102 configured to receive the substrate carrier 1300. As shown in FIG. 1, the substrate carrier 1300 may be received via a first door 106 connected by a hinge or other mechanism to a first end of the input chamber 102. In some embodiments, the first door 106 may be configured to be manually opened. Alternatively, the first door 106 may be configured to automatically open when the CVD system 100 is ready to receive the substrate carrier 1300. Similarly, as shown in FIG. 1, the substrate carrier 1300 may be discharged, or removed, via a second door 156 connected by a hinge or other mechanism to a first end of the output chamber 150. In some embodiments, the second door 156 may be manually opened. Alternatively, the second door 156 may be automatically opened when the CVD system 100 is ready to allow the discharge, or removal, of the substrate carrier 1300. In some embodiments, as shown in FIG. 10 and described in greater detail below, the first door 106 may have an aperture 176.

Figure 11A:
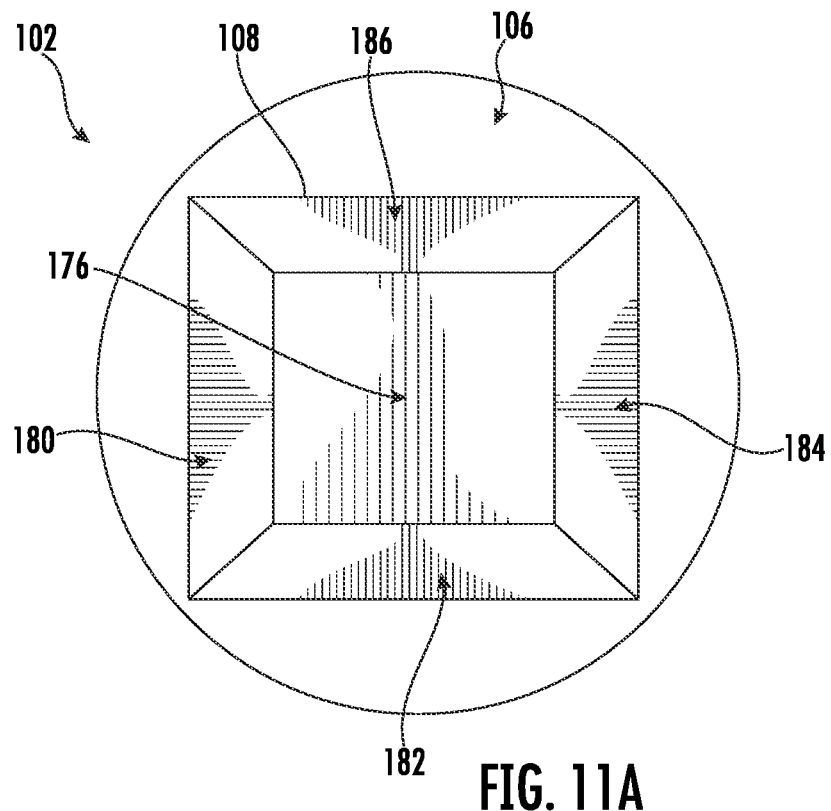
FIG. 11A is a cross-sectional view of the interior of an input chamber in accordance with one or more embodiments of the present invention.
Figure 11B:
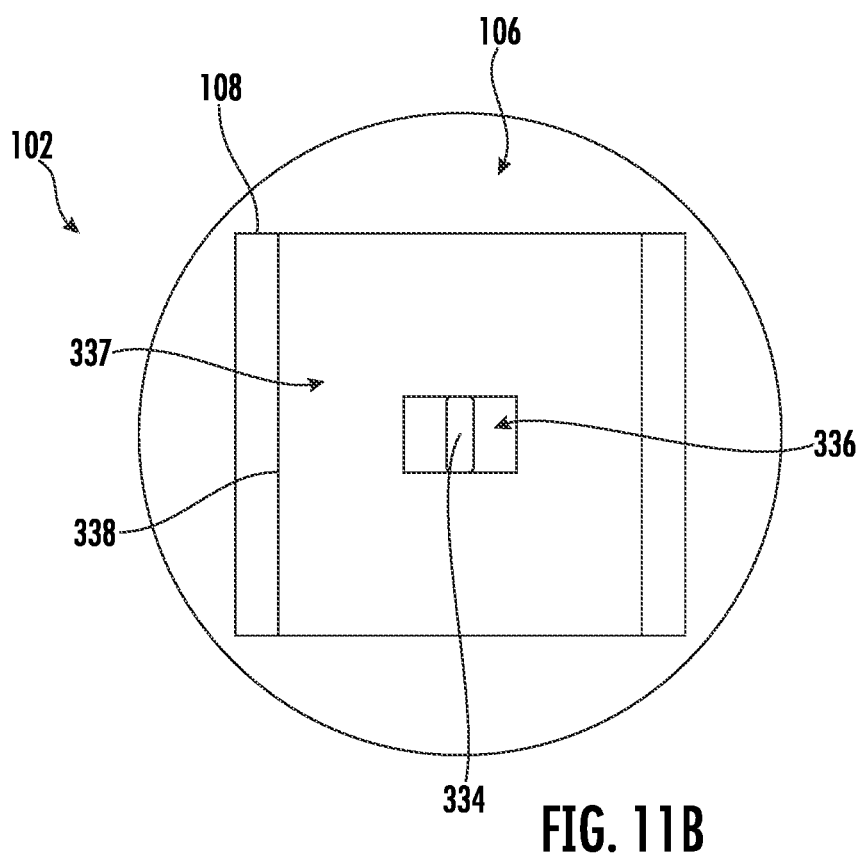
FIG. 11B is another cross-sectional view of the interior of the input chamber in accordance with one or more embodiments of the present invention.

With reference to FIGS. 1, 9A, 9B, 11A, and 11B, the CVD system 100 may further include a mechanism housing 108 configured to house components of a first mechanism 300. In some embodiments, as shown in FIGS. 1, 11A, and 11B and described in greater detail below, the first mechanism housing 108 may be connected to the first door 106. The first mechanism 300 may be configured to transfer the substrate carrier 1300 from the input chamber 102 to the process chamber 120. For example, the first mechanism 300 may be configured to transfer the substrate carrier 1300 from the input chamber 102 to the process chamber 120 when the input chamber 102 is at substantially vacuum pressure. In this way, in some embodiments, the first mechanism 300 may be configured such that the substrate carrier 1300 may be transferred from the input chamber 102 to the process chamber 120 while the first door 106 is closed, either automatically or in response to actuation by a remote operator. In some embodiments, a pump 112 may be attached to the input chamber 102 via piping 114 and may be configured to control the pressure in the input chamber 102.

Similarly, the CVD system 100 may further include a second mechanism housing 158 configured to house components of a second mechanism (not shown), complementary to the first mechanism 300. In some embodiments, as shown in FIG. 1, the second mechanism housing 158 may be connected to the second door 156. The second mechanism may be configured to transfer the substrate from the process chamber 120 to the output chamber 150. For example, the second mechanism may be configured to transfer the substrate carrier 1300 from the process chamber 120 to the output chamber 150 when the output chamber 150 is at substantially vacuum pressure. In this way, in some embodiments, the second mechanism may be configured such that the substrate may be transferred from the process chamber 120 to the output chamber 150 while the second door 156 is closed, either automatically or in response to actuation by a remote operator. In some embodiments, a pump 160 may be attached to the output chamber 150 via piping 162 and may be configured to control the pressure in the output chamber 150.

With reference to FIGS. 2-8 and 11B, the first mechanism 300 is shown. Although not shown, in some embodiments and as described above, the CVD system 100 may include a second mechanism configured to transfer the substrate carrier 1300 from the process chamber 120 to the output chamber 150. In some embodiments, the second mechanism may include identical features to the first mechanism 300 and, as such, the following discussion may apply equally to the second mechanism. In some embodiments, the first mechanism 300 may include a moveable arm 301. In some embodiments, the moveable arm 301 may comprise a foldable or telescopic jack. The moveable arm 301 may be configured to operate within the CVD system 100. In other words, the moveable arm 301 may be configured to operate in the environment (e.g. temperature and pressure) present inside the CVD system 100. The moveable arm 301 may comprise any material capable of operating in the environment inside the CVD system 100. For example, the moveable arm 301 may comprise stainless steel alloy, titanium alloy, and/or bronze.

The first mechanism 300 may further include a motor 307. By way of example, the motor 307 may be an electrical motor. The motor 307 may be configured to operate outside the CVD system 100 in a different environment (e.g., a space having a different temperature and a different pressure). In other words, the moveable arm 301 may be configured to operate inside the harsh environment of the CVD system 100 and/or the process chamber 120 of the CVD system (e.g., at substantially vacuum pressure and the necessary reactive temperature), while the motor 307 may be configured to operate in an ambient environment (e.g., at substantially atmospheric pressure and ambient temperature). The moveable arm 301 may be in electrical and/or mechanical communication with the motor 307 via a feedthrough 109. In some embodiments, the feedthrough 109 may be a rotary feedthrough. In some embodiments, the feedthrough 109 may be a ferrofluidic feedthrough.

Figure 2:
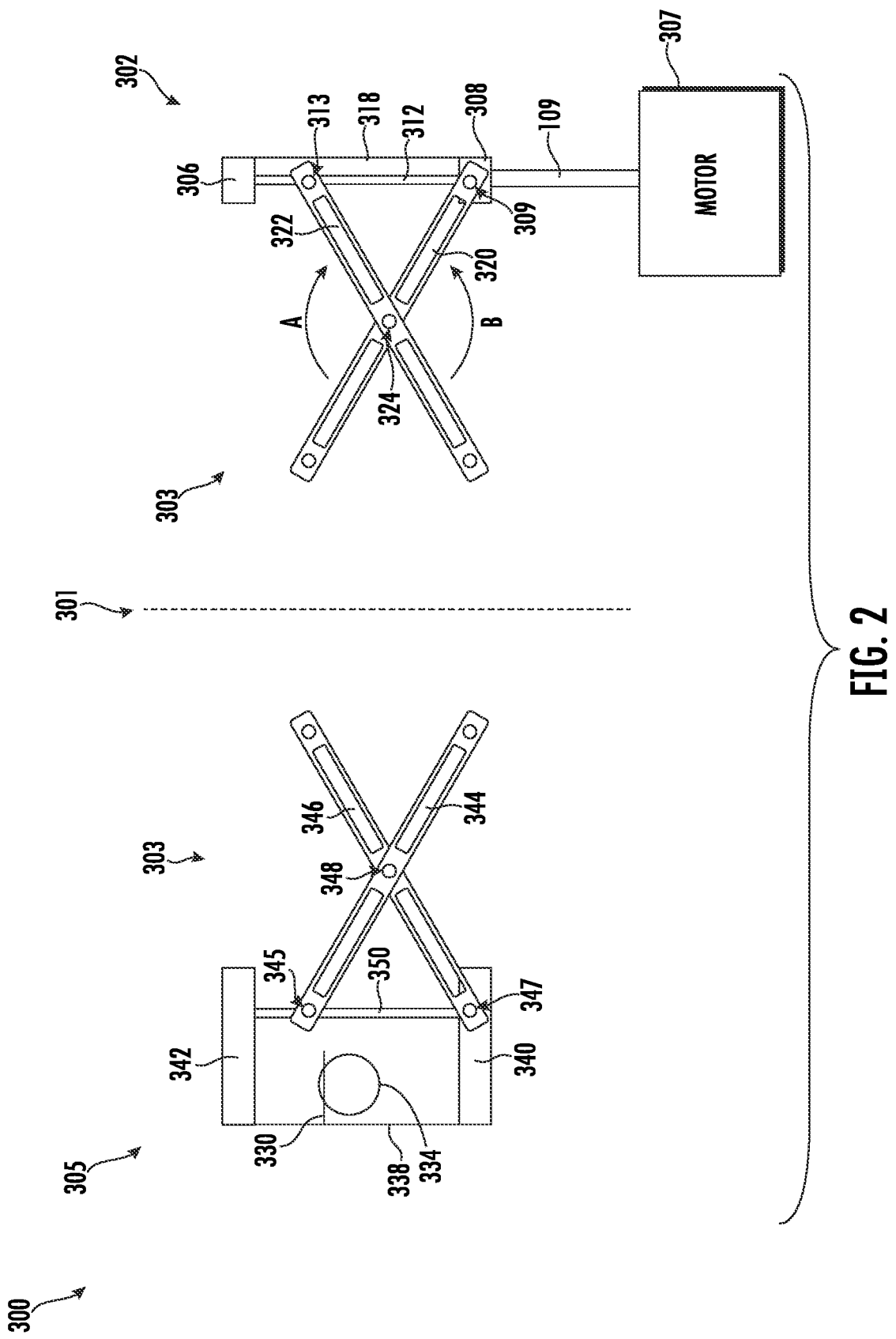
FIG. 2 is a side view of a first mechanism in accordance with one or more embodiments of the present invention.
Figure 3:
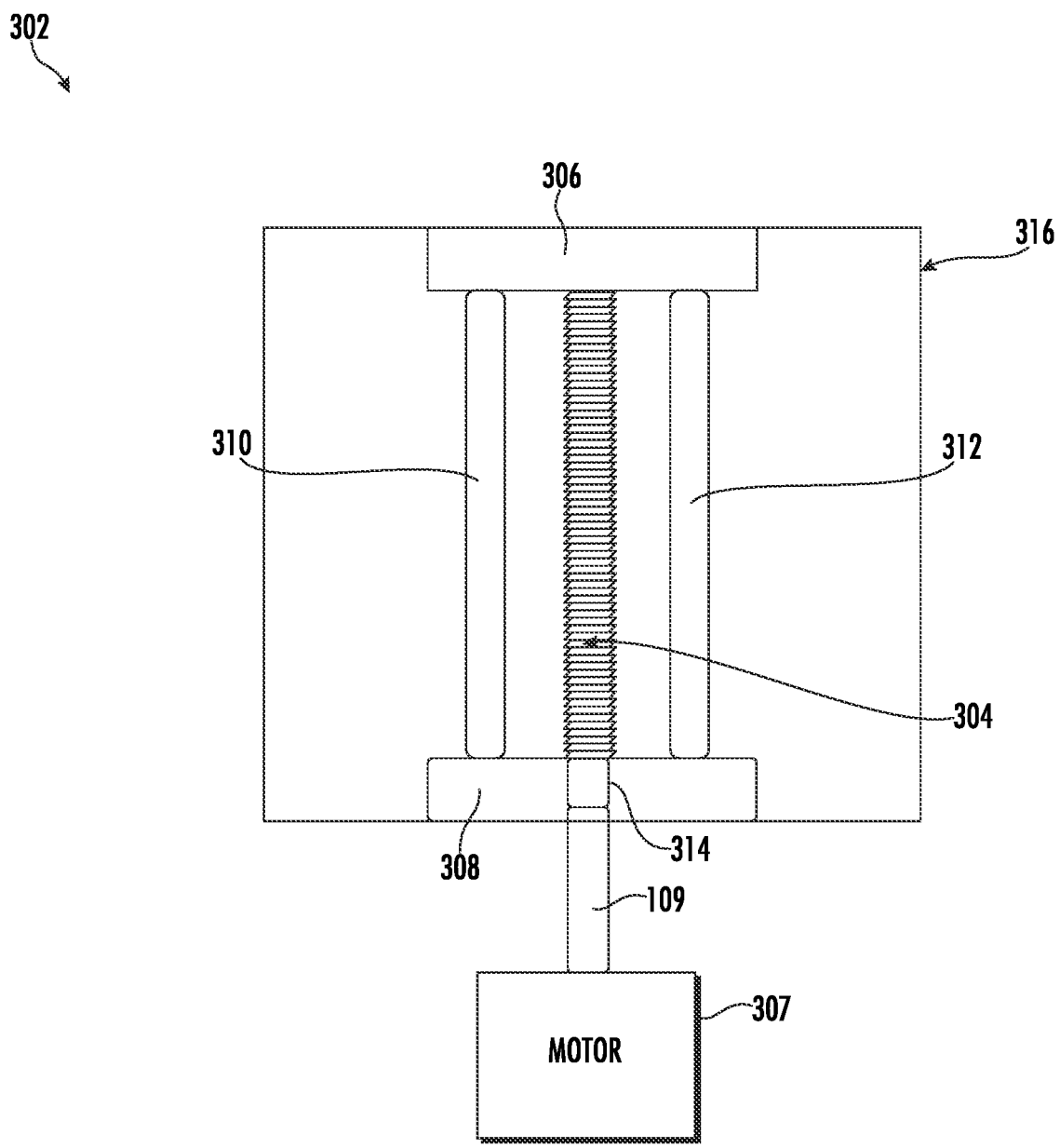
FIG. 3 is a front view of a fixed end in accordance with one or more embodiments of the present invention.

In some embodiments, as shown in FIGS. 2 and 3, the moveable arm 301 may include a fixed end 302 and a moveable end 305. The fixed end 302 may include a back plate 316 configured to be attached to a fixed surface. For example, as described in greater detail below with reference to FIGS. 9B, 11A, and 11B, the back plate 316 may be configured to be attached to an interior back wall 176 of the first mechanism housing 108. In some embodiments, the fixed end 302 may include a first support beam 306 and a second support beam 308 disposed on the surface of the fixed end 302. As shown in FIGS. 2 and 3, the fixed end 302 may further include a first support rod 310 and a second support rod 312 disposed between, and attached to, the first support beam 306 and the second support beam 308.

The fixed end 302 may further include an actuating member 304 disposed between, and attached to, the first support beam 306 and the second support beam 308. In some embodiments, the actuating member 304 may be a threaded rod. The actuating member 304 may be coupled to the feedthrough 109 via a coupler 314. As such, the mechanical motion created by the motor 307 may be transferred to the actuating member 304 via the coupler 314. As a result, and as described in greater detail below, the actuating member 304 may be configured to actuate the moveable arm 301.

As described above and shown in FIGS. 2, 5-8, and 11B, the moveable arm 301 may further include the moveable end 305 configured to engage with the substrate carrier 1300. In some embodiments, the moveable end 305 may be configured to be opposite the fixed end 302. In some embodiments, the moveable end 305 includes a plate 338 having an aperture 336. In some embodiments, the aperture 336 may be substantially rectangular, while in others it may be a different shape, such as cylindrical. In some embodiments, the aperture 336 may be configured to receive a first U-shaped member 1312 that may be engaged with the substrate carrier 1300. Alternatively, in other embodiments, the first U-shaped member 1312 may not be U-shaped, but rather may be substantially rectangular in shape. In some embodiments, the first U-shaped member 1312 may have a first length L1. In some embodiments, the moveable end 305 may further include a second U-shaped member 330 disposed on a second side 339 of the plate 338 and extending outwardly from the second side 339. In some embodiments, a rod 332 may extend between and connect legs of the second U-shaped member 330. The moveable end 305 may further include a moveable ring 334 supported by the rod 332.

Figure 6:
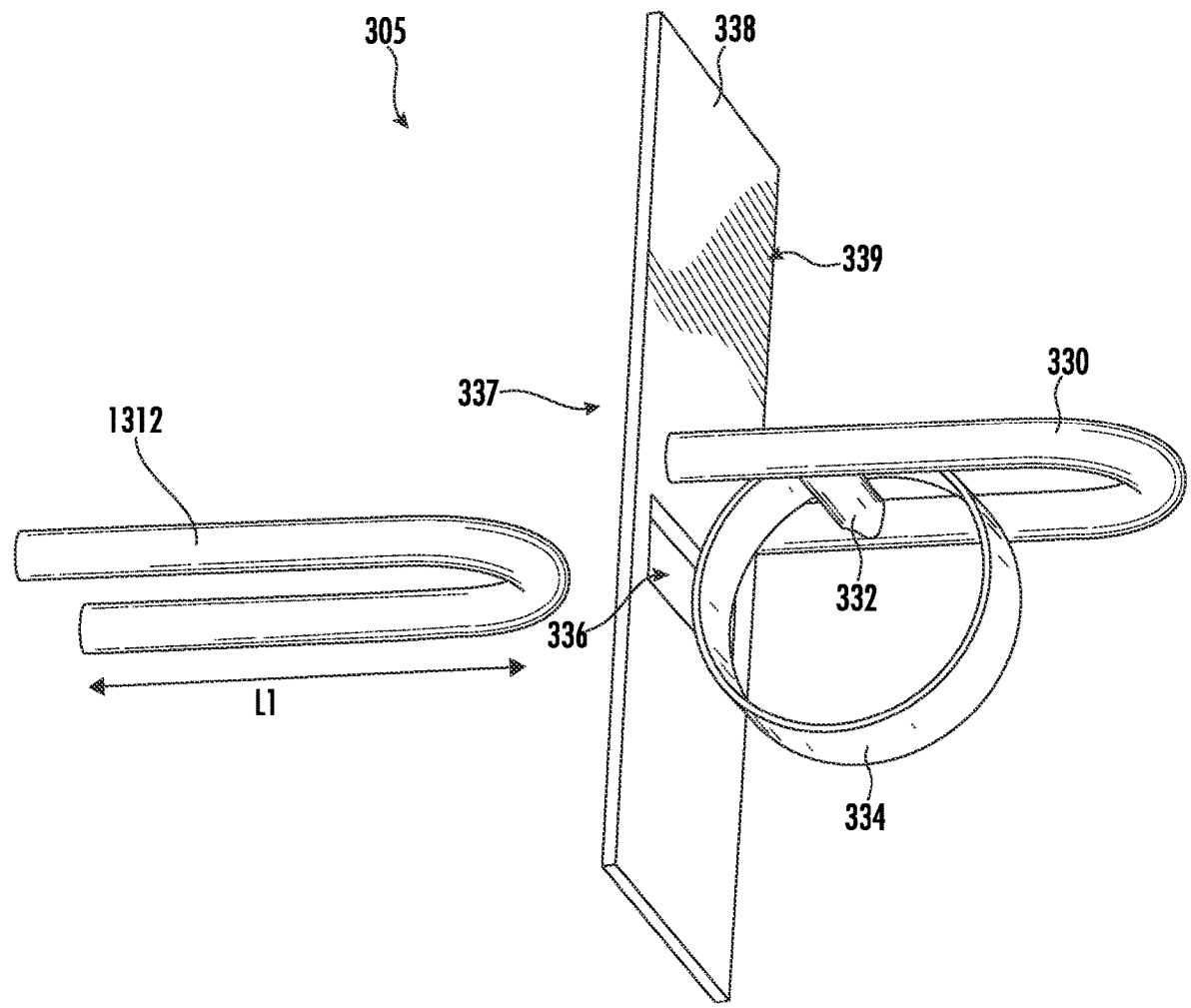
FIG. 6 is a perspective view of the moveable end shown in FIG. 5 and the first U-shaped member approaching the moveable end in accordance with one or more embodiments of the present invention.
Figure 7:
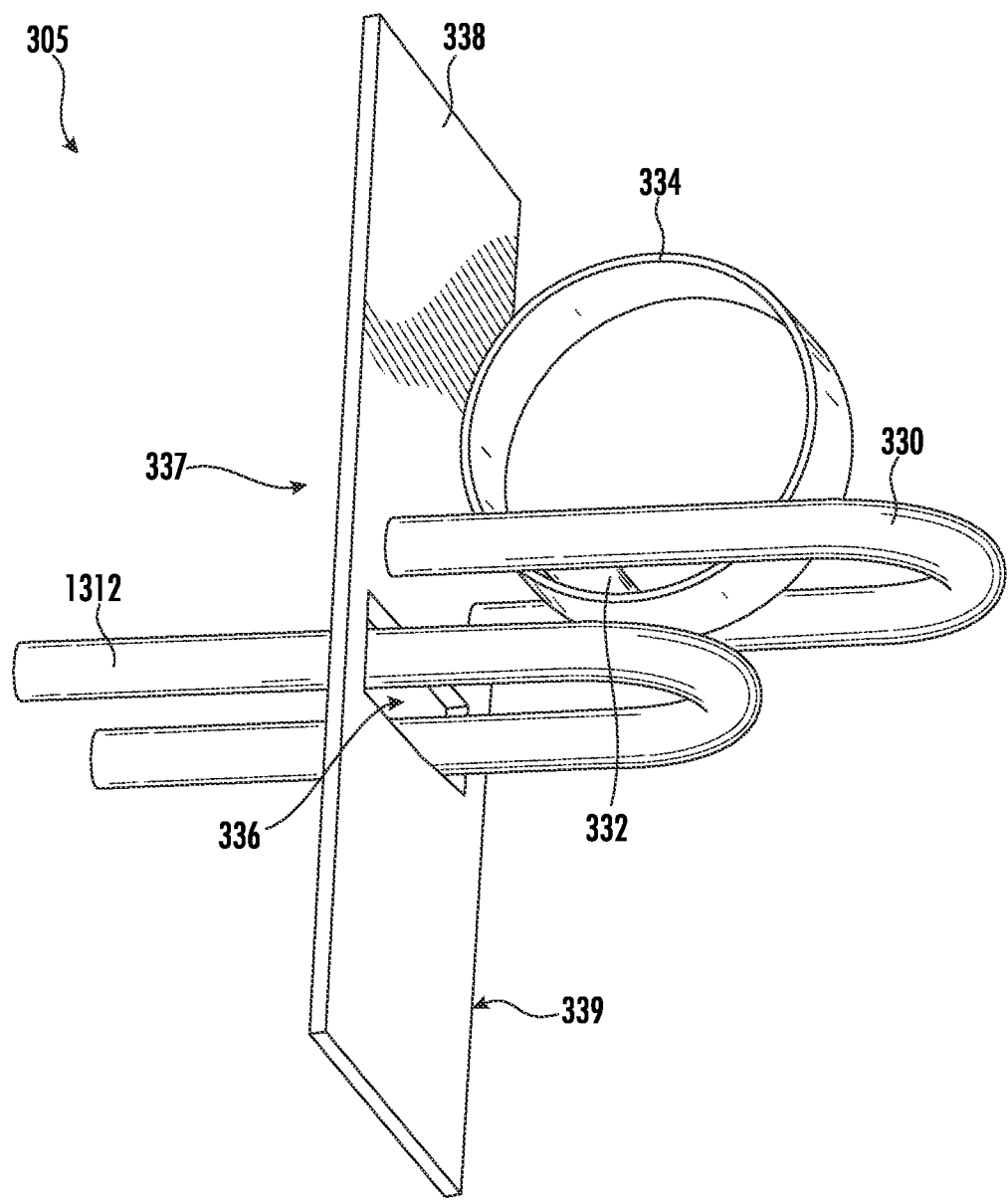
FIG. 7 is a perspective view of the moveable end shown in FIG. 5 and the first U-shaped member partially inserted into the moveable end in accordance with one or more embodiments of the present invention.
Figure 8:
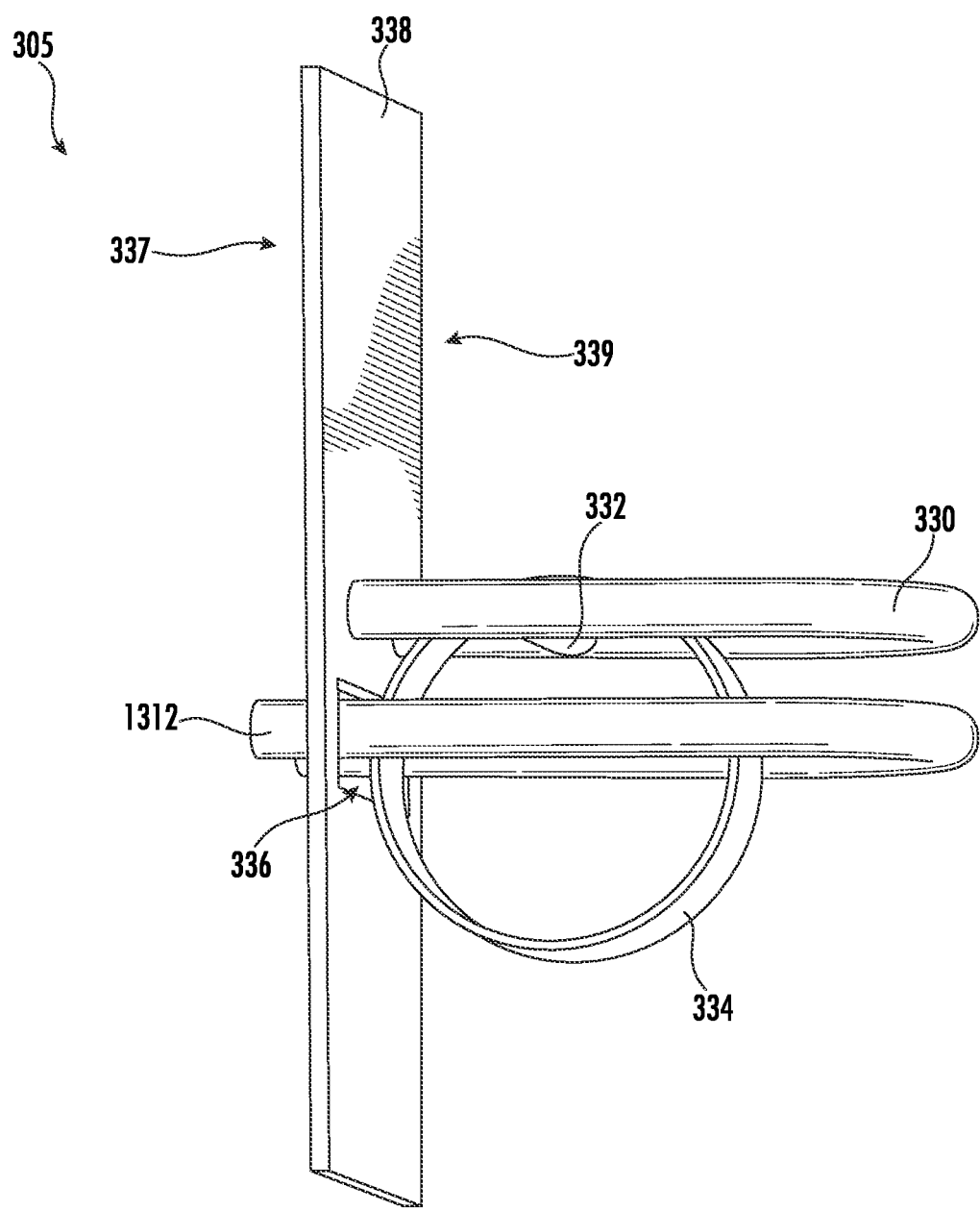
FIG. 8 is a perspective view of the moveable end shown in FIG. 5 and the first U-shaped member inserted into the moveable end in accordance with one or more embodiments of the present invention.

With reference to FIGS. 6-8, the engagement phase of the moveable arm 301 with the substrate carrier 1300 is displayed in accordance with some embodiments. As shown in FIG. 7, the moveable end 305 of the moveable arm 301 may be moved toward the first U-shaped member 1312 engaged with the substrate carrier 1300, such as via actuation of the motor 307 and extension of the extendable member 303. As shown in FIG. 7, in some embodiments, once the moveable end 305 reaches the first U-shaped member 1312, the first U-shaped member 1312 begins to enter the aperture 336 from a first side 337 of the moveable end 305. In some embodiments, as the first U-shaped member 1312 enters the aperture 336 it may cause the moveable ring 334 to slide upwards relative to the rod 332. In some embodiments, the first U-shaped member 1312 may pass through the aperture 336 until the first length L1 of the first U-shaped member 1312 has been received through the aperture 336. In some embodiments, once the first length L1 of the first U-shaped member 1312 has been received through the aperture 336, the moveable ring 334 may slide downwards relative to the rod 332. As a result, in some embodiments, once the first length L1 of the first U-shaped member 1312 is received through the aperture 336 of the moveable end 305, the first U-shaped member 1312 may be locked in position with respect to the second U-shaped member 330 via the moveable ring 334, as shown in FIG. 8. In this way, in some embodiments, the substrate carrier 1300 may be engaged with the moveable end 305 via the first U-shaped member 1312.

Figure 4:
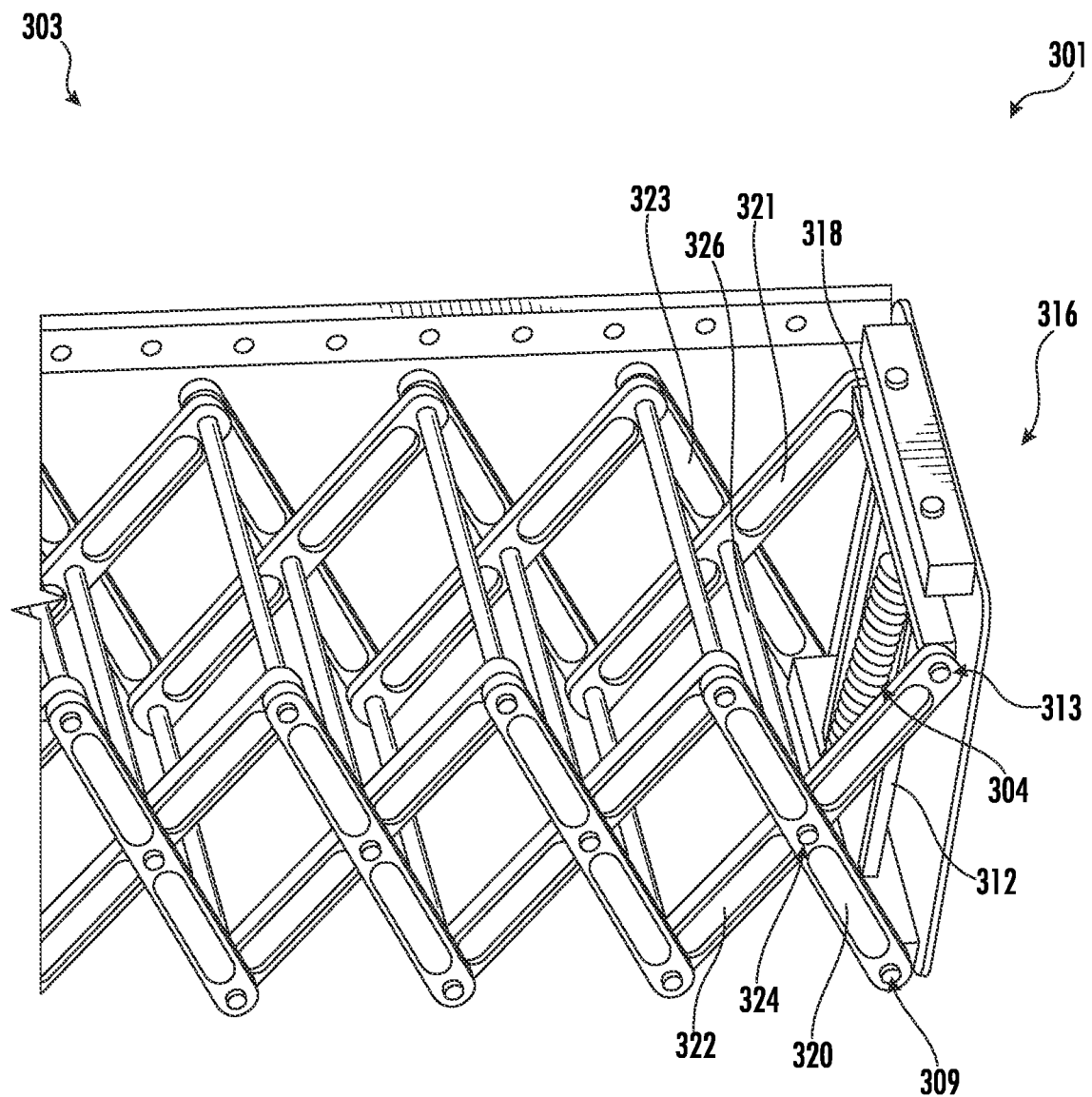
FIG. 4 is a perspective view of the fixed end shown in FIG. 3 and an extendable member in accordance with one or more embodiments of the present invention.
Figure 5:
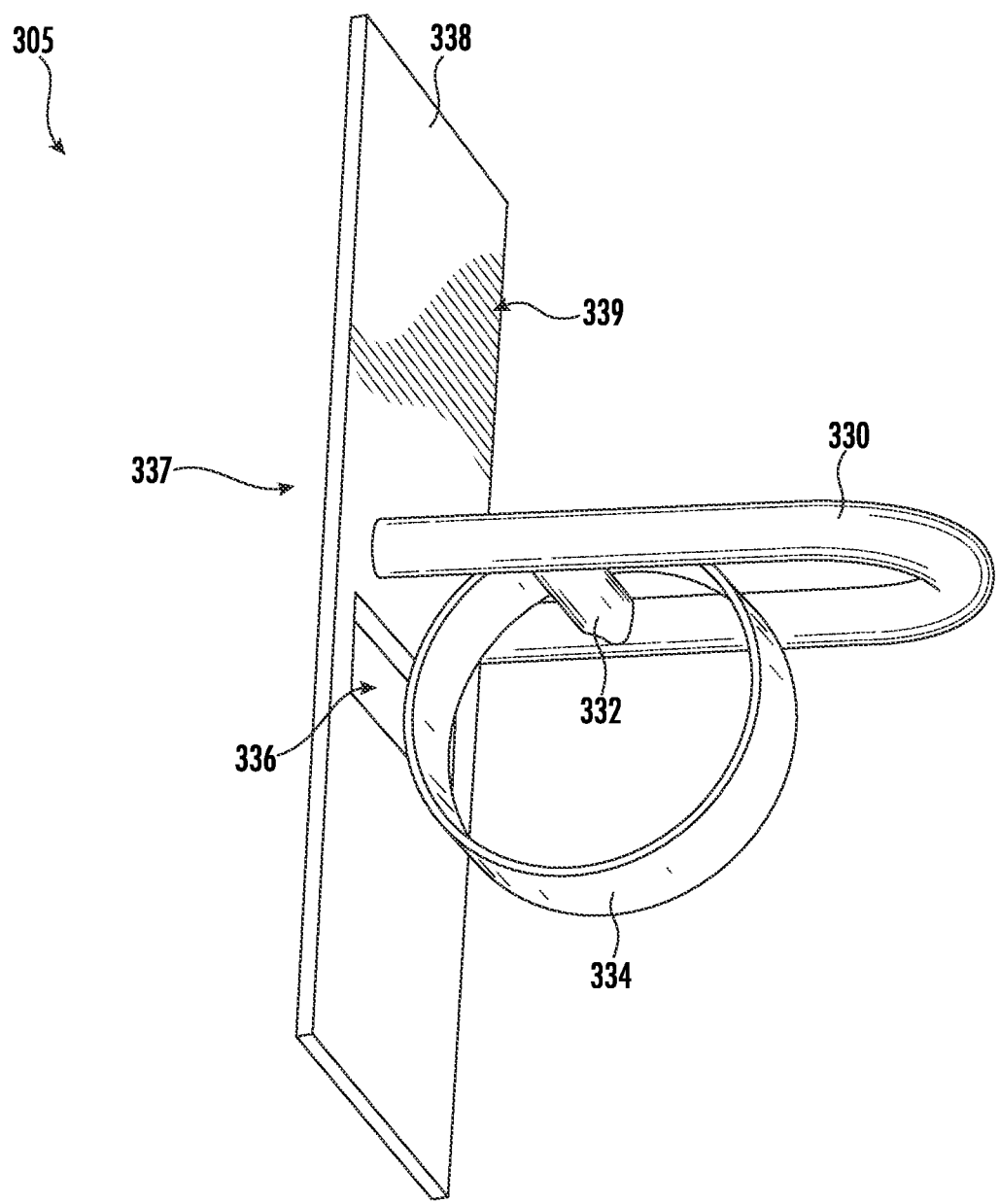
FIG. 5 is a perspective view of a moveable end in accordance with one or more embodiments of the present invention.

As described above, the moveable arm 301 may further include an extendable member 303 disposed between the fixed end 302 and the moveable end 305 and configured to extend and retract. As shown in FIG. 4, the extendable member 303 may include a first movement rod 318. In some embodiments, the first movement rod 318 may be perpendicularly attached to the first support rod 310, the second support rod 312, and the actuating member 304. In some embodiments, as shown in FIG. 4, the first movement rod 318 may be configured to include through holes through which the first support rod 310, the second support rod 312, and the actuating member 304 may pass. As such, for example, as the actuating member 304 rotates in a first direction, the first movement rod 318 may be configured to move upwards along the first support rod 310, the second support rod 312, and the actuating member 304 causing the moveable arm 301 to retract to the retracted state. Similarly, for example, as the actuating member 304 rotates in a second direction, the first movement rod 318 may be configured to move downwards along the first support rod 310, the second support rod 312, and the actuating member 304 causing the moveable arm 301 to extend to the extended state. In this way, the rotary motion of the actuating member 304 is converted into the linear motion of the moveable arm 301, such that the moveable arm 301 can extend or retract through the CVD system 100.

As shown in FIGS. 2 and 4, the extendable member 303 may include a set of beginning frame members configured to be connected to the fixed end 302. The set of beginning frame members may include a first beginning frame member 320 and a second beginning frame member 322. The first beginning frame member 320 and the second beginning frame member 322 may be connected to each other via a first beginning hinge pin 324. In some embodiments, the first beginning frame member 320 and the second beginning frame member 322 may be configured to rotate in opposite directions with respect to the first beginning hinge pin 324 while the moveable arm 301 is being actuated (e.g., extended or retracted). In other words, as the extendable member 303 is retracting such that the moveable arm 301 is being retracted to the retracted state, the first beginning frame member 320 may rotate in a first direction A with respect to the first beginning hinge pin 324 and the second beginning frame member 322 may rotate in a second direction B with respect to the first beginning hinge pin 324. In this way, the first beginning frame member 320 and the second beginning frame member 322 move toward a first position in which they become substantially parallel relative to the fixed end 302 once the moveable arm 301 reaches the retracted state. Similarly, as the extendable member 303 is extending such that the moveable arm 301 is being extended to the extended state, the first beginning frame member 320 may rotate in the second direction B with respect to the first beginning hinge pin 324 and the second beginning frame member 322 may rotate in the first direction A with respect to the first beginning hinge pin 324. In this way, the first beginning frame member 320 and the second beginning frame member 322 move toward a second position in which they become substantially perpendicular relative to the fixed end 302 (and approach a more parallel position with respect to each other) once the moveable arm 301 reaches the extended state.

In some embodiments, the first beginning frame member 320 may be connected to the second support beam 308 via a second beginning hinge pin 309. In some embodiments, the second beginning frame member 322 may be connected to the first movement rod 318 via a third beginning hinge pin 313. The set of beginning frame members may further include a third beginning frame member 321 and a fourth beginning frame member 323 complementary to and opposing the first beginning frame member 320 and the second beginning frame member 322. The first beginning frame member 320 and the second beginning frame member 322 may be connected to the third beginning frame member 321 and the fourth beginning frame member 323, via at least a first connector rod 326 (shown in FIG. 4).

As shown in FIG. 2, in some embodiments, the extendable member 303 may be connected to the moveable end 305 in a similar manner as the extendable member 303 is connected to the fixed end 302. In other words, as described above with respect to the fixed end 302, the extendable member 303 may include a set of terminal frame members configured to be connected to the moveable end 305. The set of terminal frame members may include a first terminal frame member 344 that may be connected to a second terminal frame member 346 via a first terminal hinge pin 348. The first terminal frame member 344 may be connected to a second movement rod (not shown) via a second terminal hinge pin 345 and the second terminal frame member 346 may be connected to a support beam 340 disposed on a surface of the moveable end 305 via a third terminal hinge pin 347. The set of terminal frame members may further include a third terminal frame member (not shown) and a fourth terminal frame member (not shown) complementary to and opposing the first terminal frame member 344 and the second terminal frame member 346. In some embodiments, the extendable member 303 may further include a plurality of frame member sets disposed between the set of beginning frame members and the set of terminal frame members. The number of frame members between the fixed end 302 and the moveable end 305 may vary, depending on the distance to be traversed between the input chamber 102 and the process chamber 120 or the process chamber 120 and the output chamber 150, respectively. In this way, for example, the moveable arm 301 may be configured to extend from the first mechanism housing 108, through the input chamber 102, and to at least the entrance point of the oven 132.

Similarly, as described above, in some embodiments, the CVD system 100 may include a second mechanism with identical features to the first mechanism 300. For example, although not shown, the second mechanism may include a second motor in electrical and/or mechanical communication with a second moveable arm. In some embodiments, the second moveable arm may include a second fixed end connected to a second moveable end by a second extendable member. In some embodiments, the second moveable arm may be configured to extend into the CVD system 100, engage with the substrate carrier 1300 via the second moveable end, and transfer the substrate carrier 1300 from the process chamber 120 to the output chamber 150.

Figure 9A:
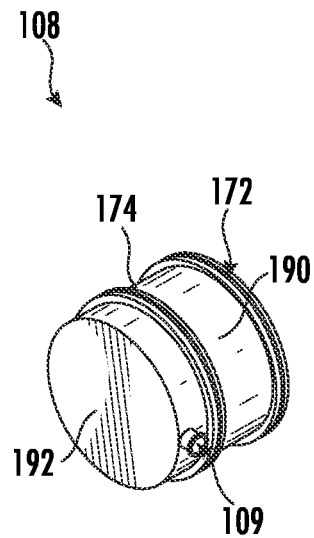
FIG. 9A is a perspective view of a first mechanism housing in accordance with one or more embodiments of the present invention.

As described above, the CVD system 100 may further include a first mechanism housing 108 configured to house the moveable arm 301 when in the retracted state. Similarly, in some embodiments and as described above, the CVD system 100 may further include a second mechanism housing 158 configured to house the second moveable arm when in the retracted state. In some embodiments, the second mechanism housing 158 located proximate the output chamber 150 may include identical features to the first mechanism housing 108, and the following discussion may apply equally to the second mechanism housing 158. In some embodiments, as shown in FIG. 9A, the first mechanism housing 108 may be substantially cylindrical. In other embodiments, as shown in FIGS. 1, 9B, 11A, and 11B the first mechanism housing 108 may be substantially rectangular. By way of example, the first mechanism housing 108 may be stainless steel, aluminum, or quartz. In other words, the first mechanism housing 108 may be any material configured to withstand the conditions of the CVD system 100.

Figure 9B:
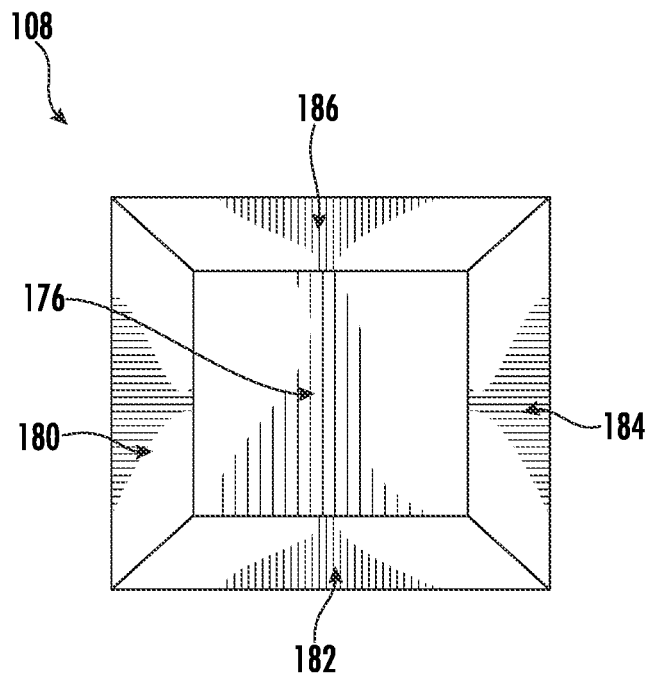
FIG. 9B is cross-sectional view of the interior of the first mechanism housing in accordance with one or more embodiments of the present invention.

In some embodiments, as shown in FIG. 9B, the first mechanism housing 108 (shown without the moveable arm 301) may comprise an interior back wall 176 and interior side walls 180, 182, 184, and 186. As described above, in some embodiments and as shown in FIG. 10, the first door 106 may have an aperture 176. In some embodiments, as shown in FIGS. 11A and 11B the first mechanism housing 108 may be connected to the first door 106 such that the first mechanism housing 108 may cover the aperture 176 in the first door 106. In this way, the interior of the input chamber 102 may be accessible from the interior of the first mechanism housing 108 while the first door 106 is closed and the CVD system 100 is in operation.

In some embodiments, the fixed end 302 of the moveable arm 301 may be attached to the interior back wall 176 of the first mechanism housing 108. In such embodiments, as shown in FIG. 11B (shown with the moveable arm 301), while the CVD process is being performed on the plurality of substrates in the substrate carrier 1300 in the process chamber 120, the moveable arm 301 may be configured to be in the retracted state such that the entire moveable arm 301 is contained within the first mechanism housing 108. In some embodiments, during the transfer process, the moveable arm 301 may be configured to extend out of the first mechanism housing 108 into the input chamber 102, engage with the substrate carrier 1300 via the moveable end 305, and transfer the substrate carrier 1300 from the input chamber 102 into the process chamber 120. In some embodiments, the moveable end 305 may engage with the substrate carrier 1300 as described above with respect to FIGS. 5-8. In other embodiments, the moveable end 305 may engage with the substrate carrier 1300 via only the plate 338. In other words, in such embodiments, the moveable end 305 may engage with the substrate carrier 1300 without receiving the first U-shaped member 1312. In some embodiments, after the substrate carrier 1300 has reached its destination in the process chamber 120, the moveable end 305 of the moveable arm 301 may be configured to disengage with the substrate carrier 1300 and the moveable arm 301 may retract back into the first mechanism housing 108. Then, the CVD process may begin on the substrate carrier 1300 now in place in the process chamber 120. In this way, in some embodiments, the moveable arm 301 of the mechanism 300 may be configured such that the substrate carrier 1300 may be transferred from the input chamber 102 to the process chamber 120 while the first door 106 is closed, either automatically or in response to actuation by a remote operator.

In some embodiments, as shown in FIG. 9A, the first mechanism housing 108 may include a first portion 190 and a second portion 192. In some embodiments, the first mechanism housing 108 may be configured such that either the first portion 190 or the second portion 192 may be detachable from the CVD system 100. As a result, the moveable arm 301 may be accessed from the exterior of the CVD system 100 by removing either the first portion 190 or the second portion 192. Further, in some embodiments, the first mechanism housing 108 may further include a first O-ring 172 and a second O-ring 174. By way of example, the first O-ring 172 and the second O-ring 174 may comprise Kalrez® compounds, copper, Viton® compounds, or silicone. Said differently, the first O-ring 172 and the second O-ring 174 may be any material that can maintain an airtight seal. In some embodiments, as in FIG. 9A, the first O-ring 172 and the second O-ring 174 may have a substantially cylindrical profile. In other embodiments, the first O-ring 172 and the second O-ring 174 may have a substantially rectangular profile. The first O-ring 172 may be configured to maintain an airtight seal between the first portion 190 of the first mechanism housing 108 and the first door 106. The second O-ring 174 may be configured to maintain an airtight seal between the first portion 190 and the second portion 192 of the first mechanism housing 108.

Figure 12:
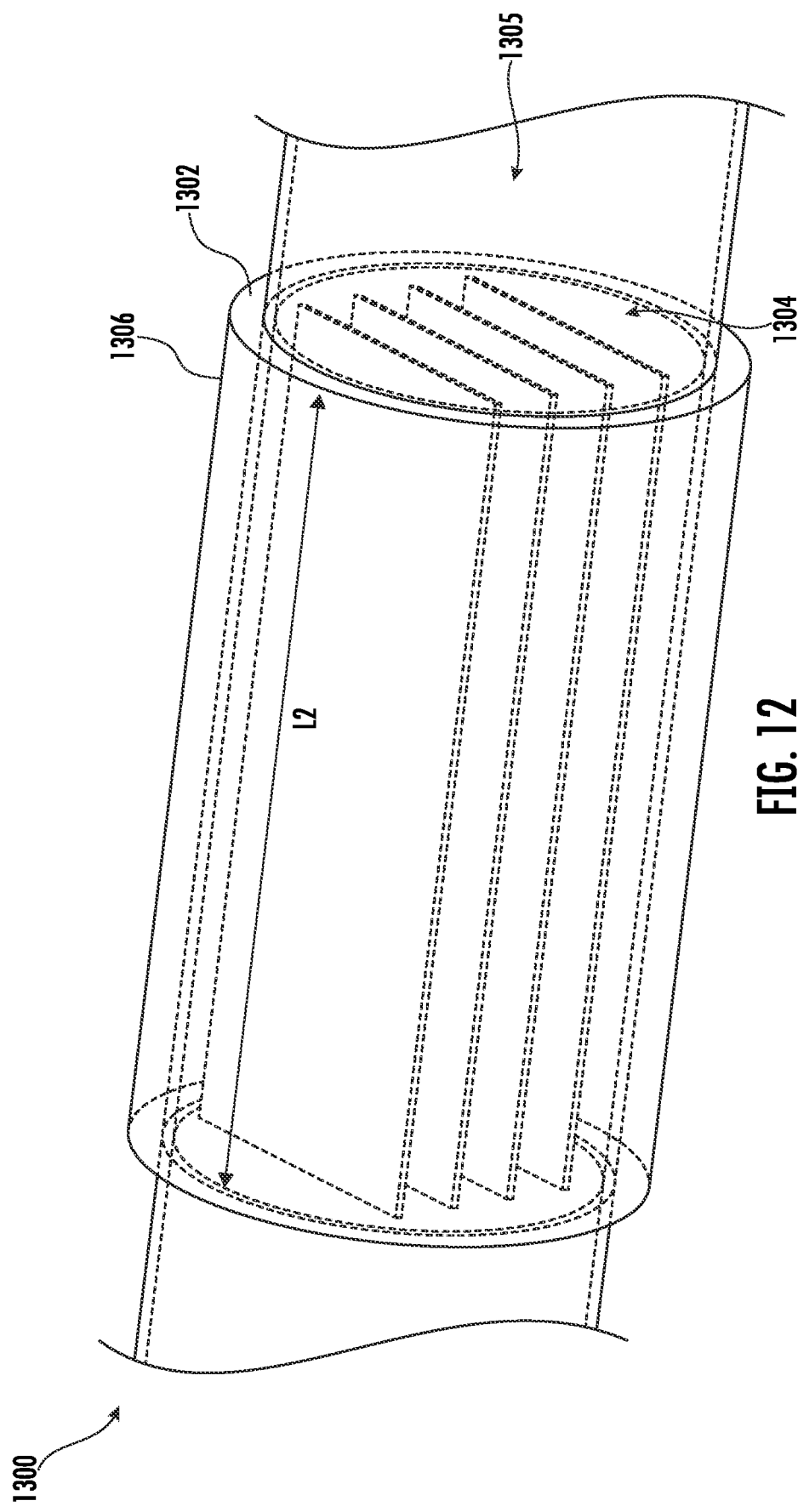
FIG. 12 is a perspective view of the substrate carrier in accordance with one or more embodiments of the present invention.
Figure 13:
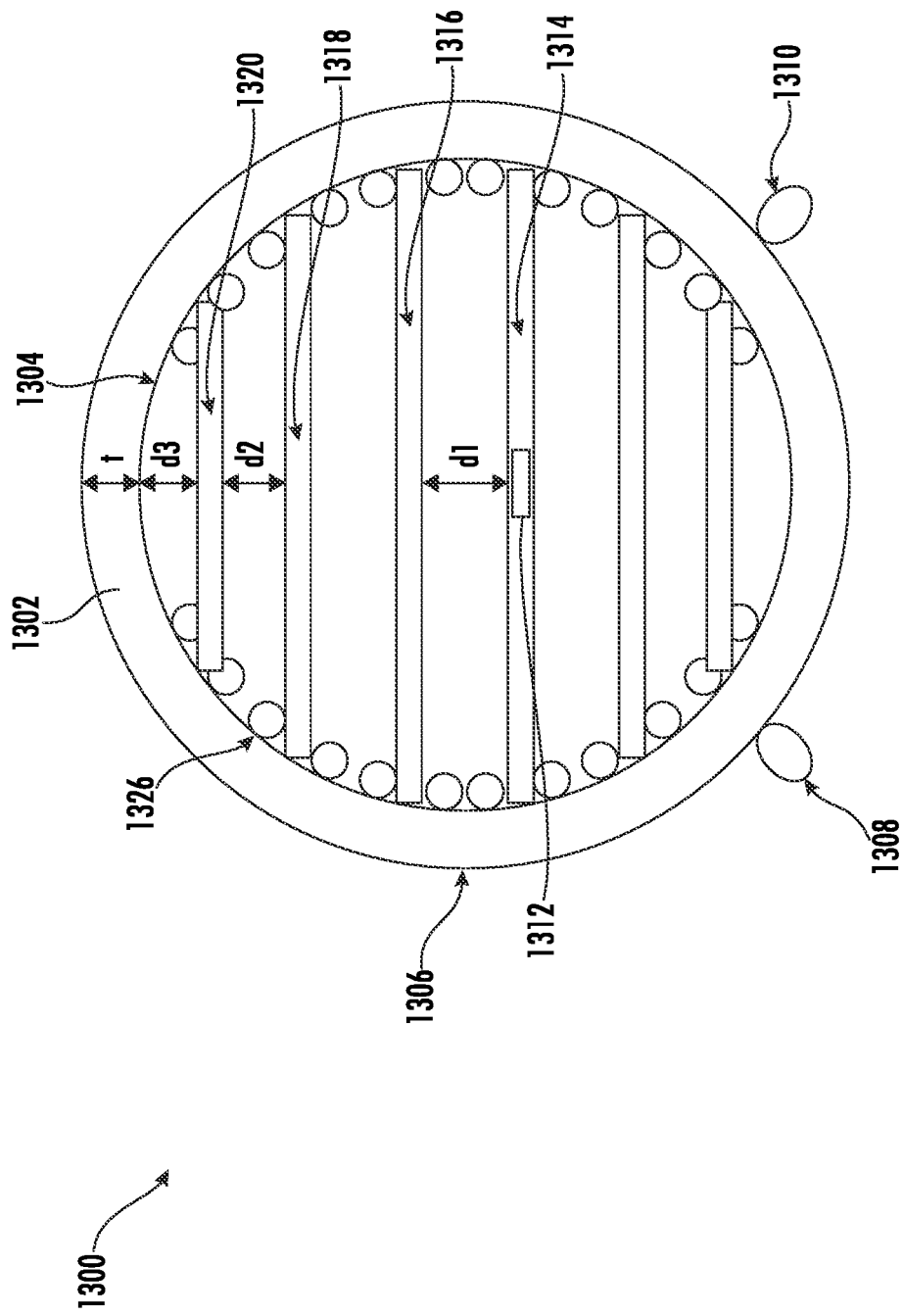
FIG. 13 is a cross-sectional view of the substrate carrier in accordance with one or more embodiments of the present invention.

In FIGS. 12 and 13, a substrate carrier 1300 configured to hold the plurality of substrates in the CVD system 100 is illustrated in accordance with some embodiments. In some embodiments, the substrate carrier 1300 may contain a cylindrical housing 1302 having an interior surface 1304 and an exterior surface 1306. In some embodiments, the cylindrical housing 1302 may have a thickness t. In some embodiments, the thickness t may be varied to produce the desired properties of the substrate carrier 1300. For example, in some embodiments, the thickness t of the substrate carrier 1300 may be reduced to lessen the weight of the substrate carrier 1300. The cylindrical housing 1302 may also have a second length L2. In some embodiments, the second length L2 of the cylindrical housing 1302 may be substantially similar to a third length L3 of the oven 132. As a result, during the CVD process, the cylindrical housing 1302 may configured to shield the interior surfaces of the oven 132, such that there is no unwanted deposition of material on the interior surface of the oven 132 as the deposition is occurring inside the cylindrical housing 1302 of the substrate carrier 1300. As a result, the cylindrical housing 1302 may reduce the frequency in which the interior surface of the oven 132 has to be cleaned, thus enabling increased production of the desired material.

In some embodiments, the substrate carrier 1300 may further include a first leg 1308 and a second leg 1310 disposed on the exterior surface of the cylindrical housing 1302. In some embodiments, the first leg 1308 and the second leg 1310 may comprise quartz or graphite. The first leg 1308 and the second leg 1310 may be configured to stabilize the substrate carrier 1300 while it is in the CVD system 100. As described above, in some embodiments, the substrate carrier 1300 may further include the first U-shaped member 1312 configured to engage with the substrate carrier 1300 to the first mechanism 300. In some embodiments, as shown in FIG. 13, the first U-shaped 1312 may be connected to a first shelf 1314. In other embodiments, the substrate carrier 1300 may include a separate metal frame disposed within the cylindrical housing 1302 and configured to be connected to the first U-shaped member 1312.

As described above, the substrate carrier 1300 may contain a plurality of shelves 1305 fixed to the interior surface 1304 of cylindrical housing 1302 via a plurality of shelf holders 1326. In some embodiments, each shelf of the plurality of shelves 1305 may be configured to support a substrate during the CVD process. In some embodiments, the plurality of shelf holders may be configured to be small relative to the size of the plurality of shelves 1305. As a result, the plurality of shelf holders may be configured to cause minimal or no interruption to the substantially uniform and laminar flow of the at least one gas through the substrate carrier 1300. Additionally, as a result, the plurality of shelf holders may be configured to allow better uniformity of the temperature of the substrates.

In some embodiments, each shelf of the plurality of shelves 1305 may be configured to be modular, such that an individual shelf can be removed from the substrate carrier 1300. As a result, the number of shelves in the cylindrical housing 1302 may be varied depending on the desired process conditions within the process chamber 120. For example, in some embodiments, the substrate carrier 1300 may be configured to contain four shelves, such as depicted in FIG. 12. In other embodiments, for example, the substrate carrier 1300 may be configured to contain six shelves, such as depicted in FIG. 13.

In some embodiments, the plurality of shelves 1305 may be spaced apart at varying dimensions so as to ensure that the shelves do not introduce turbulence nor nonuniformity into the flow of the at least one gas as the at least one gas moves through the substrate carrier 1300. Further, the plurality of shelves 1305 may be spaced apart at varying dimensions so as to ensure temperature uniformity at all points on each substrate. For example, in some embodiments, a first shelf 1314 may be separated from a second shelf 1316 by a first distance d1. In some embodiments, a third shelf 1318 may be separated from a fourth shelf 1320 by a second distance d2. Further, in some embodiments, the fourth shelf 1320 may be separated from the interior surface 1304 of the cylindrical housing 1302 by a third distance d3. In some embodiments, the shelves may be configured such that the distance d3 is greater than the distance d1 and that the distance d1 is greater than the distance d2. As a result, the substrate carrier 1300 may have an aerodynamic design that promotes the substantially uniform and laminar flow of the at least one gas over each substrate in the process chamber 120.

In some embodiments, the substrate carrier 1300 may primarily comprise quartz or graphite. In this way, the substrate carrier 1300 may be chemically inert to the at least one gas in the process chamber 120. In some embodiments, the substrate carrier 1300 may have one or more coatings deposited on the interior surface 1304 and/or the exterior surface 1306. In some embodiments, the one or more coatings may comprise one or more materials, such as silicon carbide, silicon nitride, tungsten, tungsten nitride, molybdenum, molybdenum nitride, molybdenum silicide, tantalum, tantalum nitride, titanium, titanium nitride, graphite, carbon or boron nitride. In some embodiments, one or more of the materials may be a combined with another of the one or more materials and the combination may be deposited on the interior surface 1304 and/or the exterior surface 1306. In some embodiments, the coating on the interior surface 1304 may be different than the coating on the exterior surface 1306. In some embodiments, the interior surface 1304 and/or the exterior surface 1306 may each have several coatings deposited in layers on the interior surface 1304 and/or the exterior surface 1306. For example, a first coating may be deposited first on the interior surface 1304 and/or the exterior surface 1306 and then a second coating may be deposited over the first coating. In some embodiments, the one or more coatings may be deposited on only a portion of the interior surface 1304 and/or the exterior surface 1306.

In some embodiments, the interior surface 1304 and/or the exterior surface 1306 may be coated such that infrared radiation and/or visible light are absorbed by the interior surface 1304 and/or the exterior surface 1306. For example, in such embodiments, the interior surface 1304 and/or the exterior surface 1306 may be coated with one or more of graphite, carbon, tungsten nitride, molybdenum nitride, tantalum nitride, titanium nitride, silicon carbide, silicon nitride, or a combination thereof. In some embodiments, the interior surface 1304 and/or the exterior surface 1306 may be coated such that infrared radiation and/or visible light is reflected by the interior surface 1304 and/or the exterior surface 1306. For example, in such embodiments, the interior surface 1304 and/or the exterior surface 1306 may be coated with one or more of tungsten, molybdenum, tantalum, titanium, or a combination thereof. In some embodiments, the interior surface 1304 and/or the exterior surface 1306 may be coated with a solid lubricant to enable the smooth transfer of the substrate carrier 1300 through the CVD system 100. For example, in such embodiments, the interior surface 1304 and/or the exterior surface 1306 may be coated with one or more of graphite, boron nitride, molybdenum silicide, or a combination thereof.

The composition of the substrate carrier 1300 (e.g. quartz and the one or more coatings) is configured such that it ensures temperature uniformity at all points on the substrates inside the substrate carrier 1300. In particular, the composition of the substrate carrier 1300 enables the substrate carrier 1300 to have high emissivity and high thermal conductivity. High emissivity and high thermal conductivity ensure that there is efficient and uniform heating of the plurality of substrates in the substrate carrier 1300 during the CVD process. As a result, the reaction may occur evenly at all points on the plurality of substrates, resulting in a uniform deposition of the desired material on each of the plurality of substrates.

As shown in FIG. 1, the CVD system 100 may include a control cabinet 166. The control cabinet 166 may include a processor, a memory, and communications circuitry. The control cabinet may be configured to allow a user or operator to control the operations of the CVD system 100. For example, the operator may access the control cabinet to control the pressure in the input chamber 102, the process chamber 120, and/or the output chamber 150. As another example, the operator may access the control cabinet to initiate the transfer of the substrate carrier 1300 from the input chamber 102 to the process chamber 120 and from the process chamber 120 to the output chamber 150. In yet another example, the operator may access the control cabinet to control the temperature in the oven 132. In yet another example, the operator may access the control cabinet to open and close the first gate valve 116 and the second gate valve 146 and/or to open and close the first door 106 and the second door 156.

Many modifications and other embodiments of the inventions set forth herein will come to mind to one skilled in the art to which these inventions pertain having the benefit of the teachings presented in the foregoing descriptions and the associated drawings. Although the figures only show certain components of the methods and systems described herein, it is understood that various other components may also be part of the CVD system.

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A mechanism for moving a substrate carrier through a chemical vapor deposition system, the mechanism comprising:
    a moveable arm; and
    a motor configured to actuate the moveable arm,
    wherein the moveable arm comprises:
        a fixed end configured to be attached to a fixed surface;
        a moveable end opposite the fixed end and configured to engage with a substrate carrier, and
        an extendable member disposed between and connected to the moveable end and the fixed end, wherein the extendable member comprises two complimentary sets of frame members, each set of frame members comprising multiple pairs of hingedly connected frame members,
    wherein the moveable end of the moveable arm comprises:
        a plate having an aperture;
        a U-shaped member extending outwards from the plate;
        a rod extending between and connecting legs of the U-shaped member; and
        a ring supported by the rod, wherein the ring is configured to slide upwards relative to the rod to engage the substrate carrier via a U-shaped member of the substrate carrier that is received through the aperture;
    wherein the moveable arm comprises an actuating member connected to the motor and configured to move the moveable arm between a retracted state and an extended state,
    wherein the moveable arm is configured to operate in a chamber having a first pressure and a first temperature, and
    wherein the motor is located outside the chamber in an environment having a second pressure.

2. The mechanism of claim 1, wherein the actuating member is in mechanical communication with the motor via a rotary feedthrough.

3. The mechanism of claim 1, wherein the extendable member has a first length when the moveable arm is in the retracted state and a second length when the moveable arm is in the extended state.

4. The mechanism of claim 3, wherein the second length is at least five times the first length.

5. The mechanism of claim 1, wherein the moveable arm comprises at least one of stainless-steel alloy, titanium alloy, or bronze.

6. The mechanism of claim 1, wherein the first temperature is set such that graphene deposition can be performed on a substrate in the chemical vapor deposition system.

7. The mechanism of claim 1, wherein the first pressure is a substantially vacuum pressure and the second pressure is a substantially atmospheric pressure.

8. The mechanism of claim 1, wherein the fixed end comprises a first support beam, a second support beam, a first support rod, and a second support rod, wherein the first support beam is substantially parallel to the second support beam, wherein the first support rod is substantially parallel to the second support rod, and wherein the first support rod and the second support rod are disposed between and attached to the first support beam and the second support beam.

9. The mechanism of claim 8, wherein the fixed end further comprises the actuating member and the actuating member is disposed between and supported by the first support beam and the second support beam, wherein the actuating member is configured to be actuated by the motor, and wherein the actuating member is configured to move the moveable arm between the retracted state and the extended state.

10. The mechanism of claim 9, wherein the extendable member comprises a first movement rod, wherein the first movement rod defines through holes configured to receive the first support rod, the second support rod, and the actuating member therethrough, and wherein the first movement rod is configured to move along the first support rod, the second support rod, and the actuating member in response to actuation of the actuating member.

11. The mechanism of claim 10, wherein the actuating member comprises a threaded rod, wherein the through hole defined by the first movement rod and configured to receive the actuating member defines corresponding threads on an inner surface thereof.

12. The mechanism of claim 11, wherein:
    rotation of the actuating member in a first direction causes the first movement rod to move upwards along the first support rod, the second support rod, and the actuating member, thereby moving the moveable arm toward the retracted state; and rotation of the actuating member in a second direction causes the first movement rod to move downwards along the first support rod, the second support rod, and the actuating member, thereby moving the moveable arm toward the extended state.

13. The mechanism of claim 10, wherein the extendable member comprises a first beginning frame member and a second beginning frame member, wherein the first beginning frame member and the second beginning frame member are connected to each other via a first beginning hinge pin, wherein the first beginning frame member is connected to the second support beam via a second beginning hinge pin, and wherein the second beginning frame member is connected to the first movement rod via a third beginning hinge pin.

14. The mechanism of claim 8, wherein the fixed end comprises a backplate configured to be attached to the fixed surface, wherein the first support beam and the second support beam are attached to the backplate.

15. A mechanism for moving a substrate carrier through a chemical vapor deposition system, the mechanism comprising:
a moveable arm; and
a motor configured to actuate the moveable arm,
wherein the moveable arm comprises a moveable end configured to engage with a substrate carrier, wherein the moveable end comprises:
a plate having an aperture;
a U-shaped member extending outwards from the plate;
a rod extending between and connecting legs of the U-shaped member; and
a ring supported by the rod, wherein the ring is configured to slide upwards relative to the rod to engage the substrate carrier via a U-shaped member of the substrate carrier that is received through the aperture, and
wherein, upon actuation of the motor, the moveable arm is configured to move between a retracted state and an extended state.

16. The mechanism of claim 15, wherein the moveable arm further comprises:
a fixed end configured to be attached to a fixed surface; and
an extendable member disposed between and connected to the moveable end and the fixed end, wherein the extendable member is configured to extend and retract.

17. The mechanism of claim 16, wherein the extendable member has a first length when the moveable arm is in the retracted state and a second length when the moveable arm is in the extended state.

18. The mechanism of claim 16, wherein the fixed end comprises a first support beam, a second support beam, a first support rod, and a second support rod, wherein the first support beam is substantially parallel to the second support beam, wherein the first support rod is substantially parallel to the second support rod, and wherein the first support rod and the second support rod are disposed between and attached to the first support beam and the second support beam.

19. The mechanism of claim 18, wherein the fixed end further comprises an actuating member and the actuating member is disposed between and supported by the first support beam and the second support beam, wherein the actuating member is configured to be actuated by the motor, and wherein the actuating member is configured to move the moveable arm between the retracted state and the extended state.

20. The mechanism of claim 19, wherein the actuating member is in mechanical communication with the motor via a rotary feedthrough.

21. The mechanism of claim 19, wherein the extendable member comprises a first movement rod, wherein the first movement rod defines through holes configured to receive the first support rod, the second support rod, and the actuating member therethrough, and wherein the first movement rod is configured to move along the first support rod, the second support rod, and the actuating member in response to actuation of the actuating member.

22. The mechanism of claim 21, wherein the actuating member comprises a threaded rod, wherein the through hole defined by the first movement rod and configured to receive the actuating member defines corresponding threads on an inner surface thereof.

23. The mechanism of claim 22, wherein:
rotation of the actuating member in a first direction causes the first movement rod to move upwards along the first support rod, the second support rod, and the actuating member, thereby moving the moveable arm toward the retracted state; and
rotation of the actuating member in a second direction causes the first movement rod to move downwards along the first support rod, the second support rod, and the actuating member, thereby moving the moveable arm toward the extended state.

24. The mechanism of claim 19, wherein the fixed end comprises a backplate configured to be attached to the fixed surface, wherein the first support beam and the second support beam are attached to the backplate.

25. The mechanism of claim 21, wherein the extendable member comprises a first beginning frame member and a second beginning frame member, wherein the first beginning frame member and the second beginning frame member are connected to each other via a first beginning hinge pin, wherein the first beginning frame member is connected to the second support beam via a second beginning hinge pin, and wherein the second beginning frame member is connected to the first movement rod via a third beginning hinge pin.

26. The mechanism of claim 15, wherein:
the U-shaped member of the substrate carrier is a first U-shaped member and the first U-shaped member defines an input length;
the U-shaped member extending outwards from the plate is a second U-shaped member;
the aperture is configured to receive the first U-shaped member from a first side of the plate; and
in an instance in which the first U-shaped member is received through the aperture, the ring is configured to slide upwards relative to the rod until the input length of the first U-shaped member has been received through the aperture.

* * * * *